(12) United States Patent
Araki et al.

(10) Patent No.: US 10,692,634 B2
(45) Date of Patent: *Jun. 23, 2020

(54) OXIDE SUPERCONDUCTOR AND METHOD FOR MANUFACTURING THE SAME

(71) Applicant: Kabushiki Kaisha Toshiba, Minato-ku (JP)

(72) Inventors: Takeshi Araki, Koto (JP); Hirotaka Ishii, Kawasaki (JP); Nao Kobayashi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 527 days.

This patent is subject to a terminal disclaimer.

(21) Appl. No.: 15/446,561

(22) Filed: Mar. 1, 2017

(65) Prior Publication Data

US 2018/0061537 A1 Mar. 1, 2018

(30) Foreign Application Priority Data

Aug. 23, 2016 (JP) .................. 2016-163147
Feb. 1, 2017 (JP) .................. 2017-016474

(51) Int. Cl.
*H01F 1/057* (2006.01)
*H01L 39/14* (2006.01)
(Continued)

(52) U.S. Cl.
CPC ......... *H01F 1/057* (2013.01); *C04B 35/4508* (2013.01); *C04B 35/624* (2013.01);
(Continued)

(58) Field of Classification Search
CPC ............................. H01F 6/06; C04B 35/4508
See application file for complete search history.

(56) References Cited

U.S. PATENT DOCUMENTS

| 7,615,515 B2 | 11/2009 | Araki et al. |
| 2005/0159298 A1* | 7/2005 | Rupich ............... H01L 39/2425 502/100 |

(Continued)

FOREIGN PATENT DOCUMENTS

| EP | 2 055 677 A1 | 5/2009 |
| EP | 2 704 224 A1 | 3/2014 |

(Continued)

OTHER PUBLICATIONS

Martin W. Rupich, et al., "Advances in Second Generation High Temperature Superconducting Wire Manufacturing and R&D at American Superconductor Corporation", Superconductor Sci. Technol., vol. 23, 2010, pp. 1-9.

(Continued)

*Primary Examiner* — Paul A Wartalowicz
(74) *Attorney, Agent, or Firm* — Oblon, McClelland, Maier & Neustadt, L.L.P.

(57) ABSTRACT

An oxide superconductor of an embodiment includes an oxide superconductor layer having a continuous Perovskite structure including rare earth elements, barium (Ba), and copper (Cu). The rare earth elements include a first element which is praseodymium, at least one second element selected from the group consisting of neodymium, samarium, europium, and gadolinium, at least one third element selected from the group consisting of yttrium, terbium, dysprosium, and holmium, and at least one fourth element selected from the group consisting of erbium, thulium, ytterbium, and lutetium. When the number of atoms of the first element is N(PA), the number of atoms of the second element is N(SA), and the number of atoms of the fourth element is N(CA), $1.5 \times (N(PA)+N(SA)) \leq N(CA)$ or $2 \times (N(CA)-N(PA)) \leq N(SA)$ is satisfied.

24 Claims, 14 Drawing Sheets

(51) Int. Cl.
  *H01L 39/24* (2006.01)
  *C04B 35/622* (2006.01)
  *H01L 39/12* (2006.01)
  *C04B 35/45* (2006.01)
  *C04B 35/624* (2006.01)
  *C04B 35/626* (2006.01)
  *C04B 35/64* (2006.01)
  *C23C 18/12* (2006.01)
  *H01F 1/058* (2006.01)
  *H01F 1/059* (2006.01)
  *H01F 6/06* (2006.01)
  *H01F 41/04* (2006.01)

(52) U.S. Cl.
  CPC .... *C04B 35/6264* (2013.01); *C04B 35/62218* (2013.01); *C04B 35/62222* (2013.01); *C04B 35/64* (2013.01); *C23C 18/1216* (2013.01); *C23C 18/1254* (2013.01); *C23C 18/1295* (2013.01); *H01F 1/058* (2013.01); *H01F 1/059* (2013.01); *H01F 6/06* (2013.01); *H01F 41/048* (2013.01); *H01L 39/126* (2013.01); *H01L 39/143* (2013.01); *H01L 39/2425* (2013.01); *C04B 2235/3215* (2013.01); *C04B 2235/3224* (2013.01); *C04B 2235/3225* (2013.01); *C04B 2235/3282* (2013.01); *C04B 2235/449* (2013.01); *C04B 2235/656* (2013.01); *C04B 2235/6584* (2013.01); *C04B 2235/6585* (2013.01); *C04B 2235/6588* (2013.01); *C04B 2235/663* (2013.01); *C04B 2235/768* (2013.01); *C04B 2235/79* (2013.01); *C04B 2235/80* (2013.01); *C04B 2235/81* (2013.01); *C04B 2235/96* (2013.01)

(56) References Cited

U.S. PATENT DOCUMENTS

| | | |
|---|---|---|
| 2006/0058195 A1 | 3/2006 | Araki et al. |
| 2009/0270263 A1 | 10/2009 | Aoki et al. |
| 2011/0319271 A1* | 12/2011 | Selvamanickam ... H01L 39/143 505/231 |
| 2014/0066311 A1 | 3/2014 | Araki et al. |
| 2018/0047487 A1 | 2/2018 | Araki et al. |

FOREIGN PATENT DOCUMENTS

| | | |
|---|---|---|
| EP | 3 282 492 A1 | 2/2018 |
| JP | 4208806 B2 | 1/2009 |
| JP | 2017-057114 A | 3/2017 |
| WO | WO 2017/145401 A1 | 8/2017 |

OTHER PUBLICATIONS

P. Mele, et al., "Incorporation of double artificial pinning centers in $YBa_2Cu_3O_{7-\delta}$ films", Physica C., vol. 468, 2008, pp. 1631-1634.

* cited by examiner

RELATIVELY LARGE
NUCLEATION FREQUENCY
(FOR EXAMPLE, 1/10,000)

LOWER END OF
GROWING TmBCO

UPPER END OF YBCO

RELATIVELY SMALL
NUCLEATION FREQUENCY
(FOR EXAMPLE, 1/100,000)

LOWER END OF
GROWING YbBCO

UPPER END OF YBCO

OXIDE SUPERCONDUCTOR AND METHOD FOR MANUFACTURING THE SAME

CROSS-REFERENCE TO RELATED APPLICATION

This application is based upon and claims the benefit of priority from Japanese Patent Application No. 2016-163147, filed on Aug. 23, 2016, and Japanese Patent Application No. 2017-16474, filed on Feb. 1, 2017, the entire contents of which are incorporated herein by reference.

FIELD

Embodiments described herein relate generally to an oxide superconductor and a method for manufacturing the same.

BACKGROUND

Superconduction is a phenomenon to make a resistance value completely zero, which was found using mercury by Dutch Kamerring Onnes who developed a freezer. Subsequently, a superconducting transition temperature (Tc) was defined as 39 K by Bardeen Cooper Schrieffer (BCS) theory, but this was Tc of a first type superconductor.

In a second type superconductor found by Bednorz or the like in 1986, a result better than 39 K was indicated, leading to development of an oxide superconductor which can be used at a liquid nitrogen temperature. The oxide superconductor is a second type superconductor in which a superconducting state and a non-superconducting state are mixed. At present, many high temperature oxide superconductors which can be used at a liquid nitrogen temperature are on sale in a lot of 500 m. Application of a superconducting wire is expected to various large apparatuses such as a superconducting power transmission cable, a nuclear fusion furnace, a magnetically levitated train, a particle accelerator, and a magnetic diagnostic apparatus (MRI).

Typical examples of a developed high temperature oxide superconductor include a bismuth-based superconducting wire called a first generation and an yttrium-based superconducting wire called a second generation. Manufacturing withdrawal of the first generation requiring silver in an amount of 60% by volume or more has occurred successively, and extremely a few companies manufacture the first generation now in the world.

On the other hand, a total sold wire length of the second generation in which a substrate is inexpensive and a physical strength is excellent is more than 3,000 km. A 50 MVA DC power transmission cable system manufactured using a large amount of wire materials had an operation achievement result of three years or more at the point of August 2015. Since September 2014, a DC power transmission cable system having a capacity of 500 MVA has been operated. A power transmission capacity of 500 MVA corresponds to power of approximately 50% of a standard nuclear reactor.

The wire material has been sold in a total length of 3,000 km or more. A large contract of 20 km or more in a wire length, delivery thereof, and an application achievement result thereof all used wire materials manufactured by a metal organic deposition using trifluoroacetates (TFA-MOD) method. The TFA-MOD method is a first manufacturing method which manufactures a wire material having a length of 500 m stably, can supply the wire material in a large amount, and has an application achievement result. Typical examples of another second generation manufacturing method include a pulsed laser deposition (PLD) method and a metal organic chemical vapor deposition (MOCVD) method. However, both of the methods have a problem in composition control, and have not achieved stable mass production of a wire material having a length of 500 m at present. Therefore, at present, the wire material manufactured by the TFA-MOD method has a wire material share of approximately 100%.

This fact does not deny future of the PLD method or the MOCVD method. A manufacturing method using physical deposition has difficulty in composition control. However, if a technique capable of controlling three kinds of elements flying in vacuum and having a difference of twice or more relative to one another in an atomic weight so as to have a composition difference of 1% or less at almost the same level as the TFA-MOD method using an inexpensive method is developed, mass production is possible. However, this problem has not been solved for 28 years or more since 1987.

Meanwhile, wire materials manufactured by the PLD method or the MOCVD method are leading in coil application requiring a magnetic field characteristic. This is because an artificial pin required for improving a magnetic field characteristic is easily introduced. However, a coil manufactured by using a superconducting wire manufactured by the PLD method or the MOCVD method has no satisfactory achievement result at present. The manufacturing number thereof is considered to be 20 to 30. However, it does not seem that completion of a satisfactory coil has been reported.

DETAILED DESCRIPTION

Figure 1A:
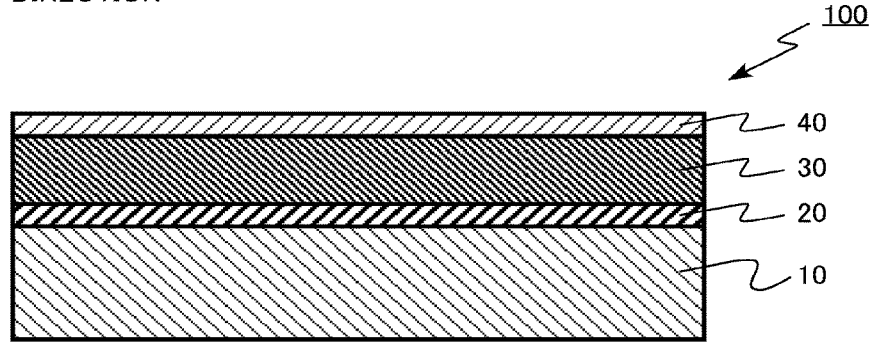
FIGS. 1A and 1B are schematic cross-sectional views of an oxide superconductor of a first embodiment.

An oxide superconductor according to an embodiment includes oxide superconductor layer having a continuous Perovskite structure including rare earth elements, barium (Ba), and copper (Cu), the rare earth elements including a first element, at least one second element, at least one third element, and at least one fourth element, the first element being praseodymium (Pr), the at least one second element being selected from the group consisting of neodymium (Nd), samarium (Sm), europium (Eu), and gadolinium (Gd), the at least one third element being selected from the group consisting of yttrium (Y), terbium (Tb), dysprosium (Dy), and holmium (Ho), and the at least one fourth element being selected from the group consisting of erbium (Er), thulium (Tm), ytterbium (Yb), and lutetium (Lu), and when the number of atoms of the first element is N(PA), the number of atoms of the at least one second element is N(SA), and the number of atoms of the at least one fourth element is N(CA), $1.5 \times (N(PA)+N(SA)) \leq N(CA)$ or $2 \times (N(CA)-N(PA)) \leq N(SA)$ is satisfied.

Here, a crystallographically continuous structure is assumed to be a "single crystal". A crystal having a low inclination angle grain boundary having a difference of 1.0 degree or less in a c-axis direction is also assumed to be a "single crystal".

Here, a pinning atom (PA) is a rare earth element acting as an artificial pin of an oxide superconductor layer. PA forms a non-superconducting unit cell. Only praseodymium (Pr) is used for PA.

Here, a supporting atom (SA) is a rare earth element for promoting clustering of an artificial pin. A trivalent ionic radius of SA is smaller than a trivalent ionic radius of PA, and is larger than a trivalent ionic radius of MA described below.

Here, a matrix atom (MA) is a rare earth element for forming a matrix phase of an oxide superconductor layer.

Here, a counter atom (CA) is a rare earth element for forming a cluster with PA or SA. A trivalent ionic radius of CA is smaller than a trivalent ionic radius of MA.

Here, a first generation type atom-replaced artificial pin (first ARP) means an artificial pin in which a non-superconducting unit cell containing PA is ultimately dispersed in a matrix phase of a superconducting unit cell containing MA. Ultimate dispersion is a form in which a non-superconducting unit cell is present alone in a matrix phase.

Here, a second generation type clustered atom-replaced artificial pin (second CARP) means an artificial pin in which a unit cell containing PA, a unit cell containing SA, and a unit cell containing CA are clustered in a matrix phase of a superconducting unit cell containing MA. The second CARP has a larger artificial pin size than the first ARP.

Here, a third generation type clustered atom-replaced artificial pin (third CARP) means an artificial pin in which a unit cell containing PA and a unit cell containing CA are clustered in a matrix phase of a superconducting unit cell containing MA. The third CARP is different from the second CARP in containing no SA.

Hereinafter, an oxide superconductor of an embodiment is described with reference to the drawings.

First Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu). When the number of atoms of the first element is N(PA), the number of atoms of the second element is N(SA), and the number of atoms of the fourth element is N(CA), $1.5 \times (N(PA)+N(SA)) \leq N(CA)$ is satisfied.

Figure 1B:
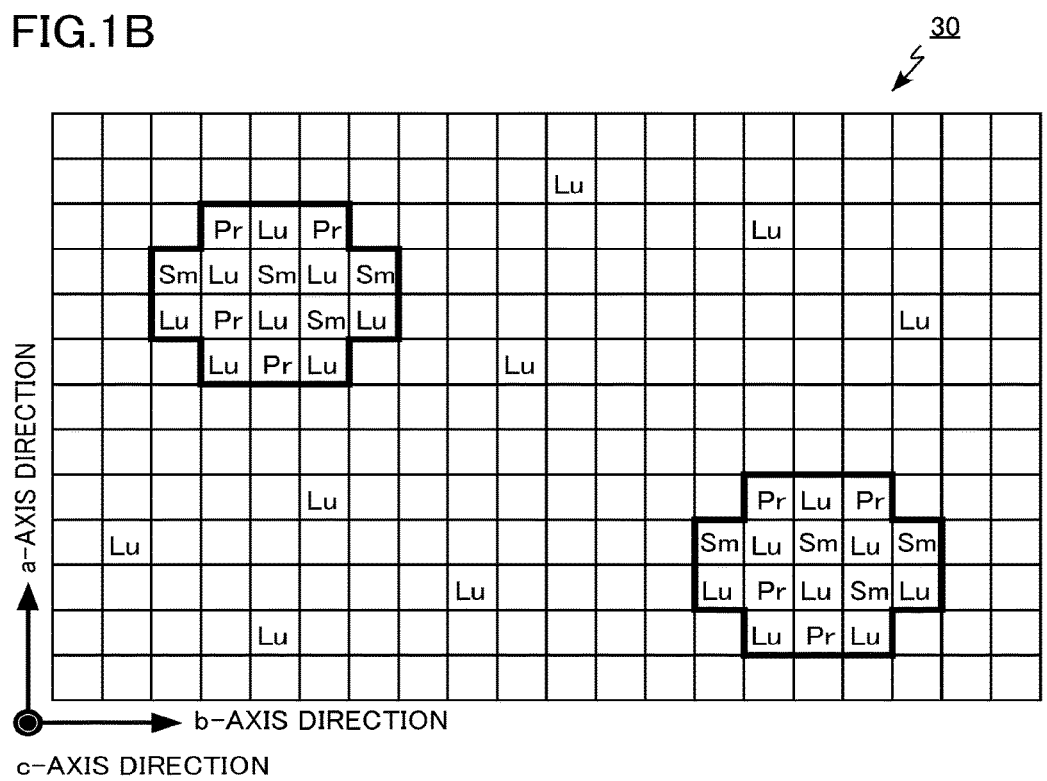

FIGS. 1A and 1B are schematic cross-sectional views of the oxide superconductor of the present embodiment. FIG. 1A is an entire cross-sectional view of the oxide superconductor in a direction parallel to a c-axis, and FIG. 1B is an enlarged schematic cross-sectional view of an oxide superconductor layer in a direction perpendicular to the c-axis.

The oxide superconductor of the present embodiment is a superconducting wire. The oxide superconductor of the present embodiment is suitable for an application under a condition in which a magnetic field is applied, for example, for a superconducting coil, a superconducting magnet, an MRI apparatus, a magnetically levitated train, or a superconducting magnetic energy storage (SMES). The oxide superconductor of the present embodiment can be also applied to a power transmission cable under a condition in which a magnetic field is applied.

As illustrated in FIG. 1A, an oxide superconductor 100 includes a substrate 10, an intermediate layer 20, an oxide superconductor layer 30, and a metal layer 40. The substrate 10 increases a mechanical strength of the oxide superconductor layer 30. The intermediate layer 20 is a so-called oriented intermediate layer. The intermediate layer 20 is provided in order to orient the oxide superconductor layer 30 to obtain a single crystal when a film of the oxide superconductor layer 30 is formed. The metal layer 40 is a so-called stabilizing layer. The metal layer 40 protects the oxide superconductor layer 30. In addition, the metal layer 40 stabilizes the oxide superconductor 100 by causing a current to be bypassed even when a superconducting state becomes partially unstable during actual use of the oxide superconductor 100 as a superconducting wire.

For example, the substrate 10 is formed of a metal such as a nickel-tungsten alloy. For example, the intermediate layer 20 is formed of yttrium oxide ($Y_2O_3$), yttria stabilized zirconia (YSZ), and cerium oxide ($CeO_2$) from the substrate 10 side. For example, a layer structure of the substrate 10 and the intermediate layer 20 is nickel-tungsten alloy/yttrium oxide/yttria stabilized zirconia/cerium oxide. In this case, the oxide superconductor layer 30 is formed on cerium oxide.

For example, the substrate 10 may be a single crystal layer lattice-matching with the oxide superconductor layer 30. For example, the single crystal layer is formed of lanthanum aluminate ($LaAlO_3$, hereinafter, also referred to as LAO). In this case, the intermediate layer 20 can be omitted.

As the substrate 10 and the intermediate layer 20, for example, an ion beam assisted deposition (IBAD) substrate can be used. When the IBAD substrate is used, the substrate 10 is a non-oriented layer. The intermediate layer 20 is, for example, formed of a five-layer structure. For example, lower two layers are non-oriented layers, an oriented source layer is formed thereon by an IBAD method, and two metal oxide oriented layers are formed thereon. In this case, the uppermost oriented layer lattice-matches with the oxide superconductor layer 30.

The oxide superconductor layer 30 has a continuous Perovskite structure containing a rare earth element, barium (Ba), and copper (Cu). The rare earth element contains a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

Hereinafter, the first element is referred to as a pinning atom (PA), the second element is referred to as a supporting atom (SA), the third element is referred to as a matrix atom (MA), and the fourth element is referred to as a counter atom (CA).

When the number of atoms of the first element is N(PA), the number of atoms of the second element is N(SA), and the number of atoms of the fourth element is N(CA), the oxide superconductor layer 30 in the present embodiment satisfies $1.5 \times (N(PA)+N(SA)) \leq N(CA)$. That is, the content of CA in the oxide superconductor layer 30 is 1.5 time or more the sum of the content of PA and the content of SA.

The oxide superconductor layer 30 in the present embodiment contains a second generation type clustered atom-replaced artificial pin (second CARP).

The kind of a rare earth element contained in the oxide superconductor layer 30 can be identified using secondary ion mass spectrometry (SIMS).

The oxide superconductor layer 30 is formed of a single crystal having a continuous Perovskite structure. For example, the Perovskite structure is described by $REBa_2Cu_3O_{7-y}$ ($-0.2 \leq y \leq 1$) (hereinafter, REBCO). RE is a rare earth site.

For example, the layer thickness of the oxide superconductor layer 30 is 0.1 μm or more and 10 μm or less. For example, the oxide superconductor layer 30 is formed of a single crystal in an entire layer thickness direction.

For example, the single crystal is present in a range of 50 nm or more from the substrate 10 side of the oxide superconductor layer 30 and 70% or less of an average layer thickness of the oxide superconductor layer 30 in the oxide superconductor layer 30. For example, the single crystal has a size of 500 nm×100 nm or more in a cross section of the oxide superconductor layer 30 in a layer thickness direction thereof.

For example, the oxide superconductor layer 30 contains fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less. The fluorine and carbon contained in the oxide superconductor layer 30 are residual elements caused by forming a film of the oxide superconductor layer 30 by a TFA-MOD method. For example, the fluorine and carbon in the oxide superconductor layer 30 are present in a grain boundary of a single crystal.

For example, the fluorine contained in the oxide superconductor layer 30 has a concentration of $2.0 \times 10^{16}$ atoms/cc or more. For example, the carbon contained in the oxide superconductor layer 30 has a concentration of $1.0 \times 10^{10}$ atoms/cc or more.

For example, the concentration of each of the fluorine and carbon in the oxide superconductor layer 30 can be measured using SIMS.

For example, the metal layer 40 is formed of a metal containing silver (Ag) or copper (Cu) as a base material, and may be an alloy. The metal layer 40 may contain a small amount of precious metal such as gold (Au).

FIG. 1B is an enlarged schematic cross-sectional view of the oxide superconductor layer 30, viewed from above a film thereof, that is, from a direction of the c-axis thereof. Each square indicates a unit cell in a single crystal.

FIG. 1B illustrates a case where PA is praseodymium (Pr), SA is samarium (Sm), MA is yttrium (Y), and CA is lutetium (Lu). The oxide superconductor layer 30 is formed of a PBCO unit cell containing praseodymium (Pr), a SmBCO unit cell containing samarium (Sm), a YBCO unit cell containing yttrium (Y), and a LuBCO unit cell containing lutetium (Lu).

Squares indicating unit cells of PrBCO, SmBCO, and LuBCO are represented by Pr, Sm, and Lu, respectively. A hollow square in FIG. 1B indicates a YBCO unit cell as a matrix phase.

The unit cells of PrBCO, SmBCO, and LuBCO form an assembly in YBCO as a matrix phase in the oxide superconductor layer 30. This assembly is referred to as a cluster. In FIG. 1B, an area surrounded by a bold solid line indicates a cluster.

PrBCO is a non-superconductor. A cluster containing PrBCO acts as an artificial pin of the oxide superconductor layer 30.

A relationship of a trivalent ionic radius among praseodymium (Pr), samarium (Sm), yttrium (Y), and lutetium (Lu) satisfies Pr>Sm>Y>Lu. In a cluster, PrBCO and SmBCO each containing a rare earth element larger than YBCO as a matrix phase and LuBCO containing a rare earth element smaller than YBCO are assembled. Hereinafter, a unit cell containing a rare earth element larger than a matrix phase is referred to as a large unit cell, and a unit cell containing a rare earth element smaller than a matrix phase is referred to as a small unit cell.

LuBCO not forming a cluster is dispersed in YBCO as a matrix phase in the oxide superconductor layer 30.

A unit cell containing MA is a matrix phase. The content of MA is the largest among the contents of rare earth elements contained in the oxide superconductor layer 30. For example, when the number of atoms of a rare earth element is N(RE), and the number of atoms of MA as the third element is N(MA), $N(MA)/N(RE) \geq 0.6$ is satisfied. In other words, a molar ratio of MA in a rare earth element contained in the oxide superconductor layer 30 is 0.6 or more.

For example, a quantitative ratio of the number of atoms of a rare earth element or the number of moles thereof in the oxide superconductor layer 30 can be calculated based on a result of concentration measurement of an element using SIMS.

Figure 2:
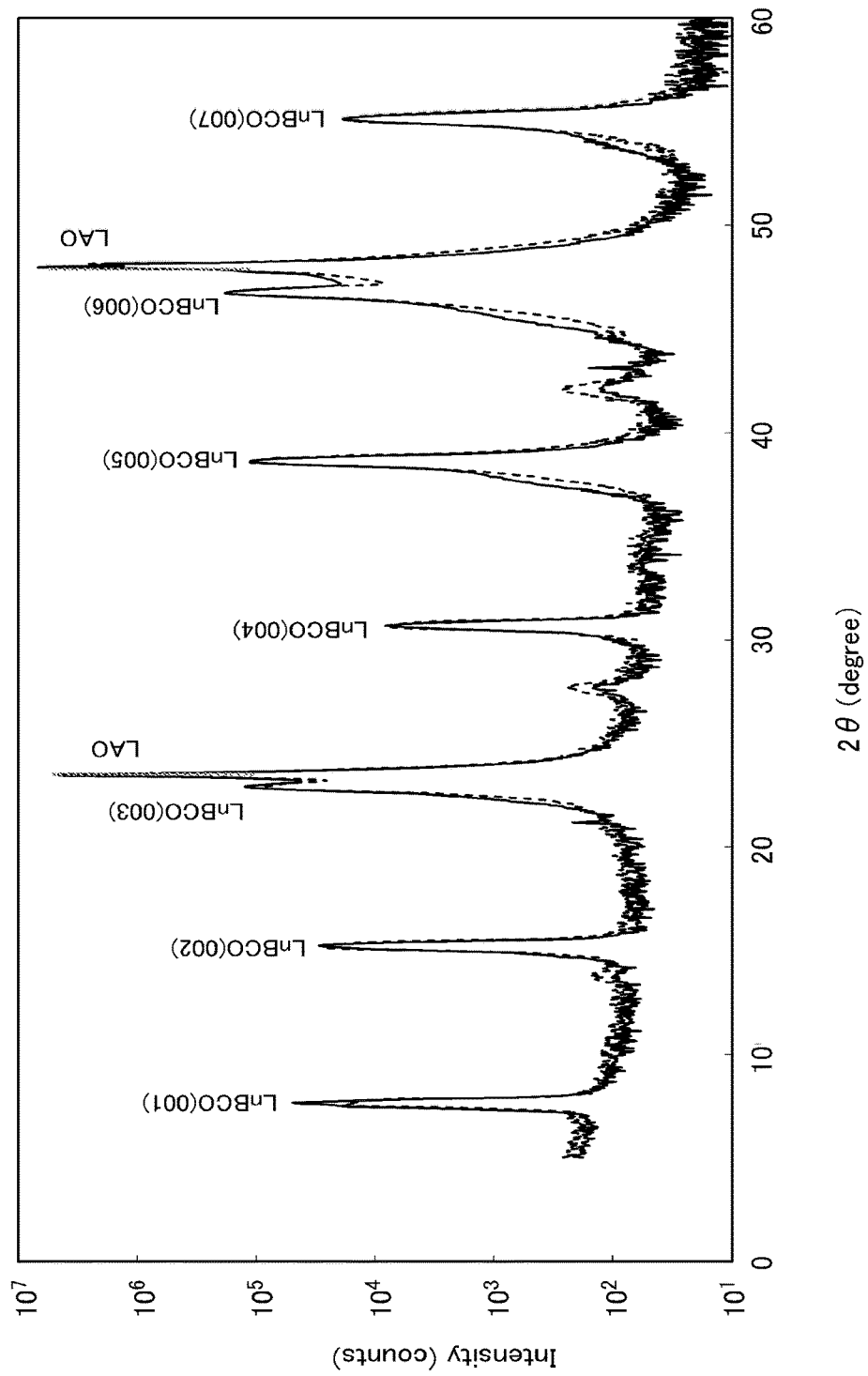
FIG. 2 is a diagram illustrating a result of X-ray diffraction measurement of an oxide superconductor layer in the first embodiment.

FIG. 2 is a diagram illustrating a result of X-ray diffraction (XRD) measurement of the oxide superconductor layer 30 in the present embodiment. The oxide superconductor layer 30 was measured by a 2θ/ω method in XRD measurement.

FIG. 2 illustrates a result of measurement of a first sample in which the contents of praseodymium, samarium, yttrium, and lutetium in the rare earth element is 1%, 1%, 96%, and 2%, respectively, and a second sample in which the contents of praseodymium, samarium, yttrium, and lutetium in the rare earth element is 1%, 1%, 88%, and 10%, respectively. The second sample having a large content of lutetium corresponds to the oxide superconductor layer 30 in the present embodiment. In FIG. 2, the first sample is indicated by a dotted line, and the second sample is indicated by a solid line.

In FIG. 2, peaks of the first sample and the second sample coincide with those of YBCO, and any other clear peaks are not confirmed. Even in the second sample containing 10% lutetium, separation of a peak is not observed. Therefore, it is found that the second sample containing 10% lutetium is also formed of a single crystal having a continuous Perovskite structure.

In FIG. 2, a peak of LAO used for a substrate also appears.

Next, a method for manufacturing the oxide superconductor 100 of the present embodiment will be described. The intermediate layer 20 is formed on the substrate 10, the oxide superconductor layer 30 is formed on the intermediate layer 20, and the metal layer 40 is formed on the oxide superconductor layer 30. The oxide superconductor layer 30 is formed by the TFA-MOD method.

In formation of the oxide superconductor layer 30, first, an aqueous solution containing an acetate of a first element which is praseodymium (Pr), an acetate of at least one second element selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), and an acetate of at least one fourth element selected from the group consisting of erbium (Er), thulium (Tm), ytterbium (Yb), and lutetium (Lu), an acetate of barium (Ba), and an acetate of copper (Cu) is prepared. When the number of moles of the first element is M(PA), the number of moles of the second element is M(SA), and the number of moles of the fourth element is M(CA), the aqueous solution satisfies $1.5 \times (M(PA)+M(SA)) \leq M(CA)$. Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel. Subsequently, an alcohol containing methanol is added to the second gel and is dissolved therein to prepare a coating solution in which a total weight of residual water and residual acetic acid is 2% by weight or less, and the coating solution is applied on a substrate to form a gel film. Subsequently, the gel film is subjected to calcining at 400° C. or lower to form a calcined film. Subsequently, the calcined film is subjected to firing under a humidified atmosphere at 725° C. or higher and 850° C. or lower and oxygen annealing to form the oxide superconductor layer (oxide superconductor film) 30.

The perfluorocarboxylic acid desirably contains 98 mol % or more trifluoroacetic acid from a viewpoint of preventing reduction of superconducting characteristics.

Figure 3:
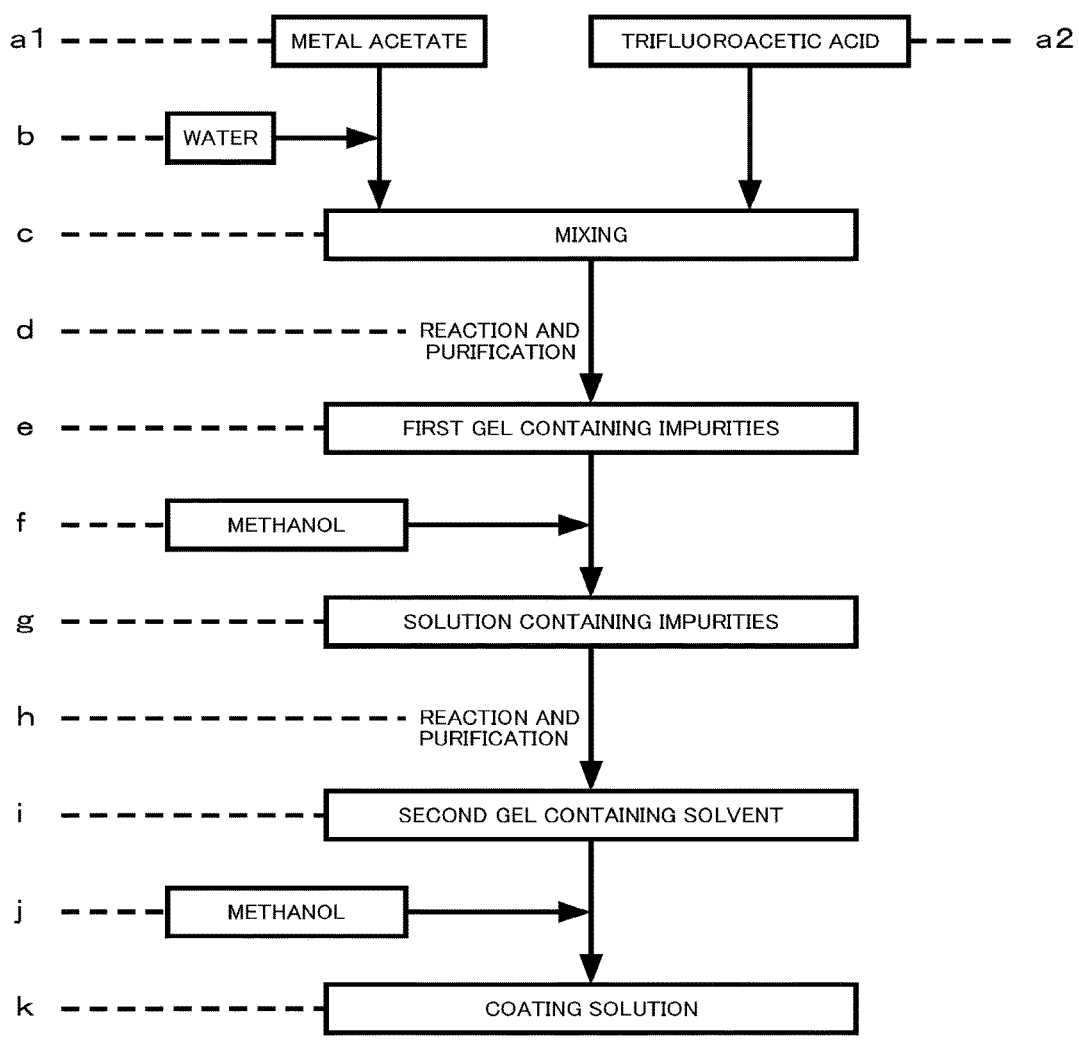
FIG. 3 is a flowchart exemplifying preparation of a coating solution in the first embodiment.

FIG. 3 is a flowchart exemplifying preparation of a coating solution in the present embodiment. Hereinafter, a case where PA as the first element is praseodymium (Pr), SA as the second element is samarium (Sm), MA as the third element is yttrium (Y), and CA as the fourth element is lutetium (Lu) is exemplified.

As illustrated in FIG. 3, a metal acetate of each of yttrium, praseodymium, samarium, lutetium, barium, and copper is prepared (a1). Trifluoroacetic acid is prepared (a2). Subsequently, the prepared metal acetate is dissolved in water to prepare an aqueous solution (b). When the number of moles of praseodymium is M(Pr), the number of moles of samarium is M(Sm), and the number of moles of lutetium is M(Lu), $1.5 \times (M(Pr)+M(SA)) \leq M(CA)$ is satisfied.

The obtained aqueous solution is mixed with the prepared trifluoroacetic acid (c). The obtained solution is subjected to a reaction and purification (d) to obtain a first gel containing impurities (e). Subsequently, the obtained first gel is dissolved in methanol (f) to prepare a solution containing impurities (g). The obtained solution is subjected to a reaction and purification, and impurities are removed (h) to obtain a second gel containing a solvent (i). Furthermore, the obtained second gel is dissolved in methanol (j) to prepare a coating solution (k).

For example, as a metal acetate, metal salts are mixed at RE site (Y, Pr, Sm, Lu):Ba:Cu=1:2:3. For example, mixing is performed such that the content of Pr in the RE site is 0.00000001 or more and 0.20 or less. After mixing and the reaction, the total content of the residual water and acetic acid in the coating solution is reduced to 2% by weight or less by a high purity solution purifying process using a stabilized solvent-into-gel (SIG) method. The SIG method in the present embodiment is a method for highly purifying a solution to be partially stabilized for preventing decomposition of PrBCO, and is a partially stabilized solvent-into-gel (PS-SIG) method. Even when an element is unstable like Pr, by mixing the element with a stable element such as Y to synthesize a solution, a stable solution as a whole can be obtained. For example, mixing is performed such that a value of Pr/(Y+Pr+Sm+Lu) is 0.0025.

Figure 4:
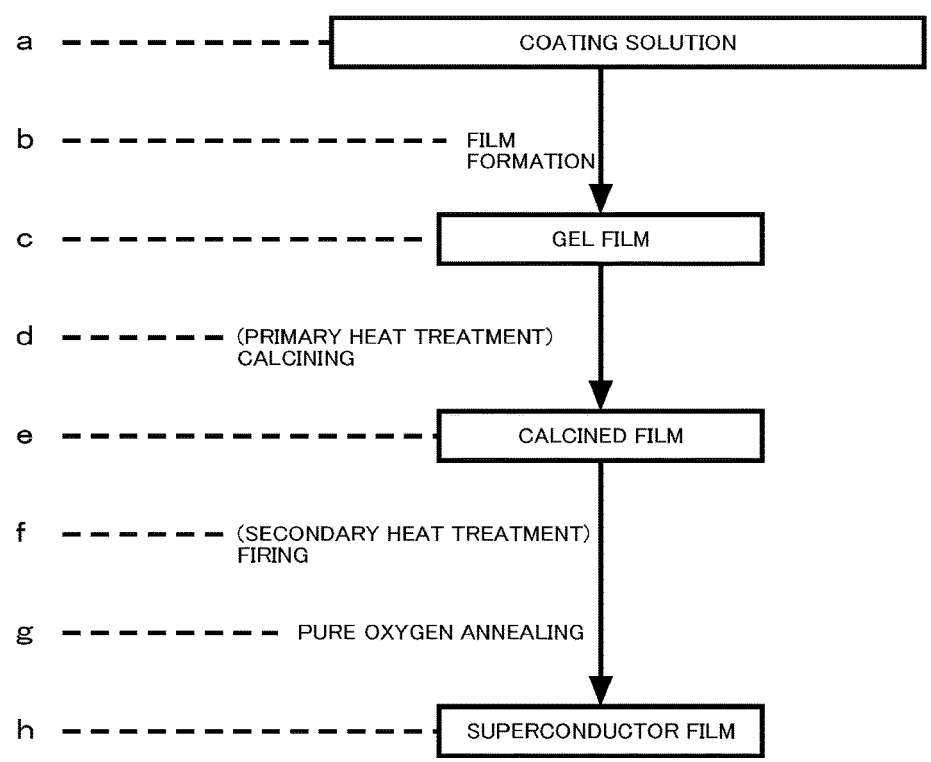
FIG. 4 is a flowchart exemplifying a method for forming a film of a superconductor from the coating solution in the first embodiment.

FIG. 4 is a flowchart exemplifying a method for forming a film of a superconductor from the coating solution in the present embodiment.

As illustrated in FIG. 4, first, the coating solution prepared in advance is prepared (a). For example, a film is formed by applying the coating solution on a substrate by a die coating method (b) to obtain a gel film (c). Subsequently, the obtained gel film is subjected to calcining as a primary heat treatment, and an organic substance is decomposed (d) to obtain a calcined film (e). Furthermore, this calcined film is subjected to firing as a secondary heat treatment (f), and then, for example, is subjected to pure oxygen annealing (h) to obtain a superconductor film (h).

Figure 5:
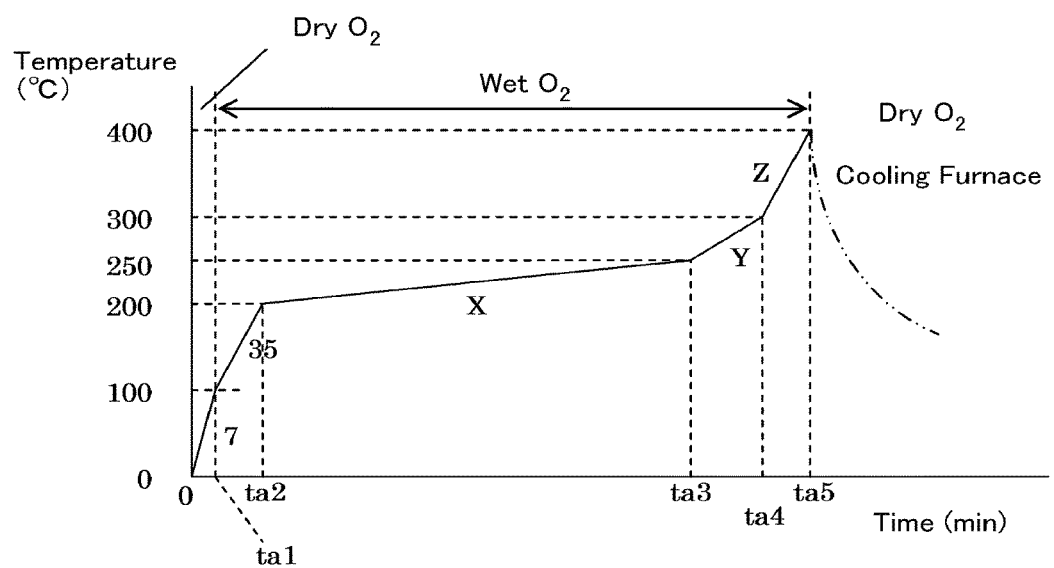
FIG. 5 is a diagram illustrating a typical calcining profile in the first embodiment.

FIG. 5 is a diagram illustrating a typical calcining profile in the present embodiment. Calcining under normal pressure decomposes a trifluoroacetate mainly at 200° C. or higher and 250° C. or lower. In order to prevent the temperature from entering the region, a temperature-rising rate is reduced around 200° C. By gradually raising the temperature to 250° C., a substance decomposed from the trifluoroacetate contains fluorine or oxygen, which easily remains in the film due to a hydrogen bond. The temperature is raised to 400° C. in order to remove the substance. A final temperature is generally from 350 to 450° C. In this way, a semitransparent brown calcined film formed of an oxide or a fluoride is obtained.

Figure 6:
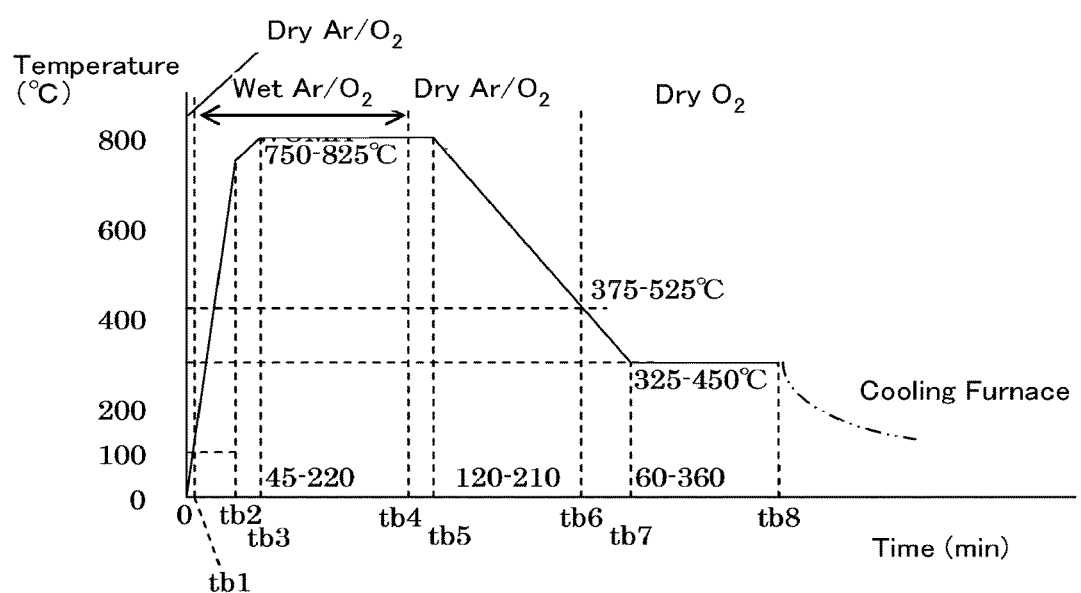
FIG. 6 is a diagram illustrating a typical firing profile in the first embodiment.

FIG. 6 is a diagram illustrating a typical firing profile in the present embodiment. Until tb1 at 100° C., a dry mixed gas is used. However, subsequently, humidification is performed. A humidification starting temperature may be 100° C. or higher and 400° C. or lower. It is considered that formation of a pseudo-liquid layer starts around 550° C. Humidification is performed at a temperature of 550° C. or lower such that a pseudo-liquid layer is uniformly formed while a humidified gas is spread in the film.

FIG. 6 illustrates a typical temperature profile of firing at 800° C. The profile is a gradual temperature-rising profile at 775° C. or higher and 800° C. or lower such that temperature overshoot at tb3 does not occur. Even in this profile, overshoot of 2 to 3° C. may remain at 800° C., but does not cause a particular problem. An oxygen partial pressure at a maximum temperature depends on a matrix phase. In a case of firing of a YBCO superconductor, the optimal oxygen partial pressure is 1000 ppm at 800° C., and becomes half whenever the temperature is lowered by 25° C. therefrom. That is, the optimal oxygen partial pressure is 500 ppm at 775° C., and is 250 ppm at 750° C. In this firing, a YBCO-based material forms $YBa_2Cu_3O_6$. At this time, the YBCO-based material is not a superconductor.

In firing at a maximum temperature, a dry gas is caused to flow at tb4 before the temperature starts to be lowered after completion of firing. A humidified gas decomposes a superconductor to generate an oxide at 700° C. or lower, and therefore oxygen annealing is performed at tb6, and the oxygen number of the superconductor is changed from 6.00 to 6.93. A substance becomes a superconductor at this oxygen number. However, only PrBCO is not a superconductor although having a Perovskite structure. The valence of Pr is unknown, and therefore the oxygen number of a unit cell thereof is also unknown, but Pr is considered to have the large oxygen number. This is because the valence of Pr is between three and four and the oxygen number is increased in accordance therewith in a unit cell. An oxygen annealing starting temperature is 375° C. or higher and 525° C. or lower. Subsequently, the temperature is maintained, and then a furnace is cooled from tb8.

By the above manufacturing method, the oxide superconductor 100 containing the oxide superconductor layer 30 according to the present embodiment is manufactured.

Next, functions and effects of the oxide superconductor 100 of the present embodiment and the method for manufacturing the same will be described.

The oxide superconductor 100 of the present embodiment contains YBCO as a matrix phase in the oxide superconductor layer 30. PrBCO as a non-superconductor is clustered together with SmBCO and LuBCO as superconductors in a matrix phase. This cluster acts as an atomic level artificial pin to improve a magnetic field characteristic. According to the method for manufacturing the oxide superconductor 100 of the present embodiment, the oxide superconductor 100 containing the cluster as an artificial pin and having a magnetic field characteristic improved can be manufactured.

The oxide superconductor layer 30 in the present embodiment is formed of PA, SA, MA, and CA. By containing SA and CA, a clustering phenomenon is caused. PA is incorporated into a cluster as a part of SA, and a clustered atom-replaced artificial pin (CARP) is formed. This clustered atom-replaced artificial pin improves a magnetic field characteristic.

Furthermore, by adding CA excessively with respect to PA and SA, the size of a cluster can be reduced. By reducing the size of a cluster, a magnetic field characteristic in a low temperature region is improved. In other words, by reducing the size of an artificial pin, a Jc-B characteristic in a low temperature region is improved.

A reason why a superconducting wire manufactured by a PLD method or a MOCVD method does not work well as an application of a coil has not become clear. By local lowering of a critical temperature (Tc) in a superconducting wire, an inner bypass current (IBC) is formed. Abnormal local generation of voltage reaching several tens μV, caused by the inner bypass current has been observed. A possibility that this abnormal generation of voltage triggers a quenching accident is considered to be high.

In order to solve the IBC problem essentially and to avoid abnormal generation of voltage, application of an atom-replaced artificial pin (ARP) is considered. ARP maintains a Perovskite structure, and a most part thereof is formed of a superconducting unit cell, but a part thereof acts as an artificial pin of a non-superconducting unit cell.

As ARP, PrBCO($PrBa_2CuO_y$) is desirably formed. PrBCO has a Perovskite structure, and forms a non-superconducting artificial pin. It is considered that Pr in PrBCO becomes $Pr^{4+}$ during formation of a Perovskite structure and that the valence is changed to about $Pr^{4+}$ in a process of cooling to normal temperature. When Pr becomes tetravalent, oxygen enters an oxygen site which has been deficient in the Perovskite structure, and a lattice length becomes shorter due to a Coulomb force.

In a case of PrBCO, a unit cell of a Perovskite structure is an assembly of 1/3 unit cells formed of two Ba atoms and one Pr atom. It is considered that the 1/3 unit cell containing Pr is contracted when Pr becomes tetravalent, a pressure is applied to a side on which the unit cell containing Ba is expanded, and a contraction ratio is reduced as one unit cell. Therefore, it is considered that a YBCO unit cell and a PrBCO unit cell adjacent to each other share the same upper and lower surfaces of the unit cells to form a continuous Perovskite structure. Therefore, when YBCO containing PrBCO is measured by a 2θ/ω method in XRD measurement, a single peak of a Perovskite structure is observed.

However, deformation by containing PrBCO as an artificial pin has an influence on a CuO surface on which a superconducting current is formed. If Y adjacent to PrBCO is present in a 1/3 unit cell in the center (first adjacent cell), it is considered that the unit cell is influenced by the deformation to cause non-superconduction. Four 1/3 unit cells in an a/b plane are influenced. An artificial pin in an amount of five times the injection amount of Pr is formed, and a "5 times degradation phenomenon" in which a Jc (critical current density) value is degraded by five times is observed.

An optimal oxygen partial pressure ($p(O_2)$) for forming a Perovskite structure of PrBCO is estimated to be 1 ppm at 800° C. Optimal oxygen partial pressures of NdBCO and SmBCO in which Nd and Sm are Pr sites are 5 ppm and 20 ppm, respectively, and are reduced inversely proportionally with an ionic radius of a lanthanoid group. Therefore, a condition for forming PrBCO is estimated to be about 1 ppm, that is, from 0.5 to 2 ppm.

Formation with PrBCO and YBCO mixed is difficult by a physical deposition method such as a PLD method or a MOCVD method. An optimal oxygen partial pressure for forming a Perovskite structure of YBCO is 1000 ppm, and YBCO can be formed at 500 to 2000 ppm. In addition, for example, in film formation with PrBCO and YBCO mixed as a target by a PLD method, even if Perovskite structures of PrBCO and YBCO can be formed simultaneously, it is considered that individual assemblies are formed by separation due to different lattice sizes. It is difficult in principle to form a Perovskite structure with YBCO and PrBCO mixed also in view of this point. In addition, by forming a film under a condition for forming YBCO, PrBCO is decomposed.

Formation with YBCO and PrBCO mixed is also difficult by a MOCVD method almost similarly. In a MOCVD method, an organic substance is decomposed after a metal element reaches a substrate. At the time of film formation, optimal oxygen partial pressures of YBCO and PrBCO are 1000 ppm and 1 ppm at 800° C., respectively. It is difficult to form a film while YBCO and PrBCO are present together.

When a film of PrBCO is formed while being present together with YBCO by a sputtering method which is a physical deposition method like a PLD method, Tc is lowered by 4 K by adding 10% PrBCO. In addition, it is considered that PrBCO is unevenly distributed in a form not incorporating a Perovskite structure. As described above, it is considered that it is difficult to form YBCO and PrBCO in a continuous Perovskite structure or in a single crystal by a physical deposition method.

Large reduction of Tc has been reported in a trial to improve a magnetic field characteristic by forming YBCO+ PrBCO in a bulk body. It is considered that this is caused by a fact that a lattice constant of a PrBCO assembly is reduced by 12 to 14% when each of PrBCO and YBCO is formed as an assembly and the valence of Pr is changed from three to about four by a succeeding valance change of Pr, physical separation from a YBCO assembly is caused, and a bonding condition of unit cells is deteriorated. A gap between unit cells lowers Tc. In other words, the report using a bulk body indicates that unit cells of YBCO and PrBCO indicated in the present embodiment cannot form a continuous Perovskite structure.

The only method for formation with PrBCO and YBCO mixed is considered to be a TFA-MOD method capable of forming a Perovskite structure from a pseudo-liquid phase and forming a film using an average value of optimal oxygen partial pressures of elements in a rare earth site as an optimal oxygen partial pressure. In the TFA-MOD method, growing occurs in a liquid phase during firing to form a pseudo-liquid phase. A result that a growing direction has an influence on a characteristic in an experiment of application of an external magnetic field is also one of evidences indicating formation of a pseudo-liquid phase. By preventing formation of a different phase by purifying a solution in growing from a pseudo-liquid phase, a continuous Perovskite structure with a plurality of rare earth elements mixed is formed. Formation of a continuous Perovskite structure is confirmed also from XRD measurement or a cross-sectional TEM observation image at a high magnification.

When a film is formed with a plurality of rare earth elements having a large difference in formation conditions in a TFA-MOD method, for example, PrBCO and YBCO mixed, by presence of impurities to cause a different phase in a solution, PrBCO and YBCO are formed separately, or a different phase is formed while one of PrBCO and YBCO is decomposed.

The TFA-MOD method is one of special forms of a conventional MOD method. In the conventional MOD method including a fluorine-free MOD method, growing occurs by a solid phase reaction. The TFA-MOD method is an extremely special form of the MOD method, and a pseudo-liquid phase is formed by presence of fluorine for growing. There is also a report that a solid phase reaction occurs by using chlorine in place of fluorine. Therefore, at present, a Perovskite structure in which unit cells having a large difference in film-formation conditions, such as PrBCO and YBCO are continuous can be formed only by the TFA-MOD method.

It is considered that a motive force to form a Perovskite structure in which rare earth elements have a large difference in ionic radius, such as PrBCO and YBCO in a continuous Perovskite structure is a clustering phenomenon. In order to cause the clustering phenomenon, unit cells having a Perovskite structure, specifically 1/3 unit cells having different sizes are combined. The size of a unit cell is determined by the size of a rare earth element contained, that is, an ionic radius thereof.

An element having a larger size is used for a pinning atom (PA) for forming an artificial pin and a supporting atom (SA) for supporting PA, and an element having a smaller size is used for a counter atom (CA) with respect to the size of a matrix atom (MA) to form a matrix phase. The clustering phenomenon is a phenomenon in which a unit cell having a larger size and a unit cell having a smaller size with respect to the size of a unit cell in a matrix phase are assembled due to shape anisotropy.

An optimal oxygen partial pressure during firing for forming a Perovskite structure has a relation with an ionic radius of an element. The larger an ionic radius is, the smaller an optimal oxygen partial pressure is. For example, the order of the size of an ionic radius is La>Pr>Nd>Sm>Gd>Dy>Tm>Lu. It is considered that optimal oxygen partial pressures required for the elements to form a Perovskite structure during firing at 800° C. are about 0.2, 1, 5, 20, 200, 1000, 2000, and 3000 ppm, respectively.

By the TFA-MOD method using a high purity solution, films of elements having largely different optimal oxygen partial pressures are formed simultaneously, and a clustered atom-replaced artificial pin (CARP) having a Perovskite structure continuous with a matrix phase can be formed.

In order to realize an optimal magnetic field characteristic in a specific temperature region, it is desirable to adjust the size of an artificial pin. In general, in order to improve a magnetic field characteristic in a low temperature region, an artificial pin having a smaller size than in a high temperature region is desirable. Therefore, in order to realize an optimal magnetic field characteristic in a low temperature region, formation of an artificial pin having a smaller size than in a high temperature region is desirable.

However, it has been found that it is not easy to change the size of CARP. For example, Y, Sm, and Lu are selected for MA, SA, and CA, respectively. A candidate for PA is only Pr. In this system, a magnetic field characteristic is measured (Jc-B measurement) while the total content of Pr, Sm, and Lu with respect to the total amount of the system is changed to 4%, 8%, or 16% with a ratio thereof fixed to Pr:Sm:Lu=1:1:2. Even when the total content is changed, temperature dependency of a curve of the magnetic field characteristic is not largely changed. This fact indicates that change of the total content of Pr, Sm, and Lu causes proportion between the content of an element added and a nucleation frequency and CARP having the same average size is consequently generated with only the number thereof changed.

In the present embodiment, CA is excessively added with respect to PA and SA. That is, when the number of atoms of the first element as PA is N(PA), the number of atoms of the second element as SA is N(SA), and the number of atoms of the fourth element as CA is N(CA) in the oxide superconductor layer 30, $1.5 \times (N(PA)+N(SA)) \leq N(CA)$ is satisfied. The number of atoms of CA in the oxide superconductor layer 30 is 1.5 time or more the sum of the numbers of atoms of PA and SA. In other words, the number of moles of CA in the oxide superconductor layer 30 is 1.5 time or more the sum of the numbers of moles of PA and SA.

In the present embodiment, by increasing the number of CA, the nucleation frequency of an artificial pin is increased. As a result, an artificial pin having a smaller size than a case where CA is not excessively added can be formed. In other words, by increasing the number of CA, the nucleation frequency of CARP is increased. As a result, CARP having a smaller size than a case where CA is not excessively added can be formed.

Figure 7:
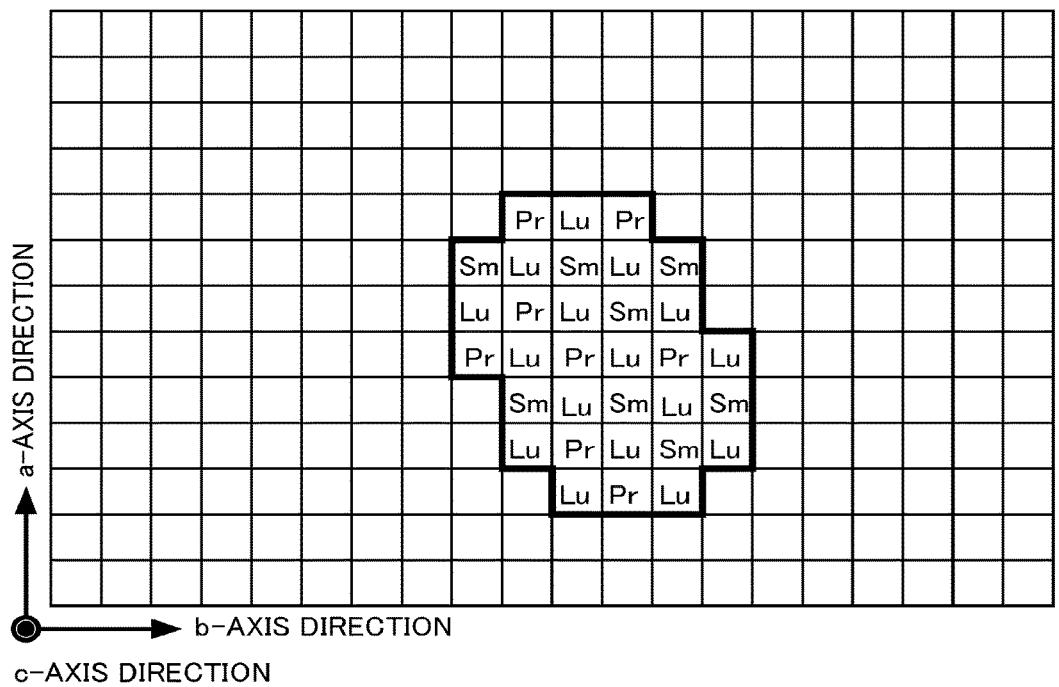
FIG. 7 is a diagram illustrating functions and effects of the first embodiment.

FIG. 7 is a diagram illustrating functions and effects of the present embodiment. FIG. 7 is an enlarged schematic cross-sectional view of an oxide superconductor layer in a comparative embodiment. The comparative embodiment uses an oxide superconductor layer to which CA is not excessively added with respect to PA and SA unlike the present embodiment. FIG. 7 is a cross-sectional view corresponding to FIG. 1B in the present embodiment.

As clear from comparison between FIG. 7 and FIG. 1B, in the present embodiment, by adding Lu as CA excessively with respect to Pr as PA and Sm as SA, a cluster having a small size can be formed. A unit cell containing an excessive amount of Lu is dispersed in a matrix phase.

CARP is formed by assembling unit cells each containing PA, SA, or CA. When CARP is formed while the contents satisfy PA+SA=CA, it is considered that all the elements other than MA are assembled in a cluster to form a most stable structure. When the content of PA+SA is not changed but the content of CA involved in nucleation is increased, it is considered that the nucleation frequency is increased and the size of a cluster is reduced.

In the present embodiment, the oxide superconductor layer 30 includes an artificial pin having a small size, and a magnetic field characteristic is thereby improved in a low temperature region.

When the number of atoms of a rare earth element is N(RE), and the number of atoms of the third element as MA is N(MA), N(MA)/N(RE)≥0.6 is desirably satisfied. When the ratio is less than the above range, a ratio of a superconducting unit cell in the oxide superconductor layer 30 is reduced, and there is a risk that a sufficient superconducting characteristic could not be obtained.

When the number of atoms of a rare earth element is N(RE), and the number of atoms of the first element as PA, that is, praseodymium is N(PA), a Pr ratio can be represented by N(PA)/N(RE). Therefore, 0.00000001≤N(PA)/N(RE) is desirably satisfied. When the ratio is less than the above range, an artificial pin becomes insufficient, and there is a risk that a sufficient effect for improving a magnetic field characteristic could not be obtained.

When the number of atoms of the third element as MA is N(MA), and the number of atoms of yttrium contained in the third element is N(Y), N(Y)/N(MA)≥0.5 is desirably satisfied. A material of yttrium (Y) is relatively inexpensive, and therefore cost of the oxide superconductor 100 can be reduced.

When the number of atoms of a rare earth element is N(RE), the number of atoms of the first element as PA is N(PA), and the number of atoms of the second element as SA is N(SA), (N(PA)+N(SA))/N(RE)≤0.2 is desirably satisfied. When the ratio is more than the above range, a ratio of a superconducting unit cell is reduced, and there is a risk that a sufficient superconducting characteristic could not be obtained.

The oxide superconductor layer 30 desirably contains fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less.

For example, it is considered that residual fluorine and residual carbon maintain a magnetic field characteristic in such a very high magnetic field to exceed 15 T.

The fluorine contained in the oxide superconductor layer 30 more desirably has a concentration of $2.0 \times 10^{16}$ atoms/cc or more from the above viewpoint. For example, the carbon contained in the oxide superconductor layer 30 more desirably has a concentration of $1.0 \times 10^{18}$ atoms/cc or more.

When the number of atoms of the first element as PA is N(PA), the number of atoms of the second element as SA is N(SA), and the number of atoms of the fourth element as CA is N(CA) in the oxide superconductor layer 30, 4×(N(PA)+N(SA))≤N(CA) is desirably satisfied. CARP having a small size is formed, and a magnetic field characteristic in a low temperature region is further improved.

Preferably, 1.5×(N(PA)+N(SA))≤N(CA) is satisfied, the second element is at least one selected from the group consisting of neodymium (Nd) and samarium (Sm), the third element is at least one selected from the group consisting of yttrium (Y), dysprosium (Dy), and holmium (Ho), and the fourth element is at least one selected from the group consisting of erbium (Er), thulium (Tm), and ytterbium (Yb). More preferably, the second element is samarium (Sm), the third element is at least one selected from the group consisting of yttrium (Y) and holmium (Ho), and the fourth element is at least one selected from the group consisting of erbium (Er) and thulium (Tm). A smaller difference in an ionic radius between MA and CA makes a nucleation frequency of CARP higher. Therefore, CARP having a small size is formed, and a magnetic field characteristic in a low temperature region is further improved.

As described above, according to the present embodiment, an oxide superconductor capable of forming an artificial pin having a small size and having a magnetic field characteristic in a low temperature region improved, and a method for manufacturing the same are realized.

Second Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu). When the number of atoms of the first element is N(PA), the number of atoms of the second element is N(SA), and the number of atoms of the fourth element is N(CA), 2×(N(CA)−N(PA))≤N(SA) is satisfied.

In a method for manufacturing the oxide superconductor of the present embodiment, first, an aqueous solution containing an acetate of a first element which is praseodymium (Pr), an acetate of at least one second element selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), and an acetate of at least one fourth element selected from the group consisting of erbium (Er), thulium (Tm), ytterbium (Yb), and lutetium (Lu), an acetate of barium (Ba), and an acetate of copper (Cu) is prepared. When the number of moles of the first element is M(PA), the number of moles of the second element is M(SA), and the number of moles of the fourth element is M(CA), the aqueous solution satisfies 2×(M(CA)−M(PA))≤M(SA). Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel. Subsequently, an alcohol containing methanol is added to the second gel and is dissolved therein to prepare a coating solution in which a total weight of residual water and residual acetic acid is 2% by weight or less, and the coating solution is applied on a substrate to form a gel film. Subsequently, the gel film is subjected to calcining at 400° C. or lower to form a calcined film. Subsequently, the calcined film is subjected to firing under a humidified atmosphere at 725° C. or higher and 850°

C. or lower and oxygen annealing to form an oxide superconductor layer (oxide superconductor film) 30.

The oxide superconductor of the present embodiment is different from the first embodiment in that SA is added excessively to the oxide superconductor layer 30. Hereinafter, description of matters overlapping with the first embodiment is omitted.

In the present embodiment, SA is added excessively. That is, when the number of atoms of the first element as PA is N(PA), the number of atoms of the second element as SA is N(SA), and the number of atoms of the fourth element as CA is N(CA) in the oxide superconductor layer 30, $2\times(N(CA)-N(PA))\leq N(SA)$ is satisfied. The number of atoms of SA in the oxide superconductor layer 30 is twice or more the difference between the numbers of atoms of CA and PA. In other words, the number of moles of SA in the oxide superconductor layer 30 is twice or more the difference between the numbers of moles of CA and PA.

It is considered that SA is also involved in nucleation of a cluster acting as an artificial pin similarly to CA. In the present embodiment, by increasing the number of SA, the nucleation frequency of an artificial pin is increased. As a result, an artificial pin having a smaller size than a case where SA is not excessively added can be formed. In other words, by increasing the number of SA, the nucleation frequency of CARP is increased. As a result, CARP having a smaller size than a case where SA is not excessively added can be formed.

According to the present embodiment, similarly to the first embodiment, an oxide superconductor capable of forming an artificial pin having a small size and having a magnetic field characteristic in a low temperature region improved, and a method for manufacturing the same are realized.

Third Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of gadolinium (Gd), yttrium (Y), terbium (Tb), dysprosium (Dy), and holmium (Ho), and at least one third element selected from the group consisting of erbium (Er), thulium (Tm), ytterbium (Yb), and lutetium (Lu). When the number of atoms of the first element is N(PA), and the number of atoms of the third element is N(CA), $1.5\times N(PA)$ N(CA) is satisfied.

The oxide superconductor of the present embodiment is different from the first embodiment in that an oxide superconductor layer 30 contains no supporting atom (SA) in the first embodiment. Hereinafter, description of matters overlapping with the first embodiment is omitted.

The oxide superconductor layer 30 in the present embodiment contains a third generation type clustered atom-replaced artificial pin (third CARP).

The oxide superconductor layer 30 in the present embodiment is formed of PA, MA, and CA. The first element is a pinning atom (PA), the second element is a matrix atom (MA), and the third element is a counter atom (CA).

In the present embodiment, by increasing the number of CA with respect to PA, the nucleation frequency of an artificial pin is increased. As a result, an artificial pin having a smaller size than a case where CA is not excessively added can be formed.

Furthermore, in the oxide superconductor layer 30 in the present embodiment, SA as a superconducting unit cell is not present, and therefore a potential of an artificial pin is equal to a complete non-superconductor. Therefore, a pin force becomes a theoretically maximum value.

According to the present embodiment, similarly to the first embodiment, an oxide superconductor capable of forming an artificial pin having a small size and having a magnetic field characteristic in a low temperature region improved, and a method for manufacturing the same are realized. Furthermore, SA for forming a superconducting unit cell in an artificial pin is not contained, and a magnetic field characteristic is thereby improved.

Fourth Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least two fourth elements selected from the group consisting of erbium (Er), thulium (Tm), ytterbium (Yb), and lutetium (Lu).

In a method for manufacturing the oxide superconductor of the present embodiment, first, an aqueous solution containing an acetate of a first element which is praseodymium (Pr), an acetate of at least one second element selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), and an acetate of at least two fourth elements selected from the group consisting of erbium (Er), thulium (Tm), ytterbium (Yb), and lutetium (Lu), an acetate of barium (Ba), and an acetate of copper (Cu) is prepared. Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel.

Subsequently, an alcohol containing methanol is added to the second gel and is dissolved therein to prepare a coating solution in which a total weight of residual water and residual acetic acid is 2% by weight or less, and the coating solution is applied on a substrate to form a gel film. Subsequently, the gel film is subjected to calcining at 400° C. or lower to form a calcined film. Subsequently, the calcined film is subjected to firing under a humidified atmosphere at 725° C. or higher and 850° C. or lower and oxygen annealing to form the oxide superconductor layer (oxide superconductor film) 30.

The oxide superconductor of the present embodiment is different from the first embodiment in that at least two kinds of CAs as fourth elements are added to the oxide superconductor layer 30. Hereinafter, description of matters overlapping with the first embodiment is omitted.

In the present embodiment, the oxide superconductor layer 30 contains at least one kind of PA, at least one kind of SA, at least one kind of MA, and at least two kinds of CAs. For example, PA is praseodymium (Pr), SA is samarium (Sm), MA is yttrium (Y), and CAs are ytterbium (Yb) and lutetium (Lu).

In order to realize an optimal magnetic field characteristic in a specific temperature region, it is necessary to adjust the size of an artificial pin. In other words, there is a size of an artificial pin in order to realize an optimal magnetic field characteristic in a specific temperature region.

There is a correlation between a nucleation frequency of an artificial pin and the size thereof. The higher the nucleation frequency of an artificial pin is, the smaller the size thereof is. The lower the nucleation frequency of an artificial pin is, the larger the size thereof is.

For example, in the present embodiment, the oxide superconductor layer 30 contains ytterbium (Yb) and lutetium (Lu) having different ionic radii as CA. By containing two kinds of CAs having different ionic radii, the size of an artificial pin is controlled.

For example, in formation of CARP in YBCO, addition of ytterbium (Yb) to lutetium (Lu) increases a nucleation frequency of an artificial pin. In other words, YbBCO has a higher nucleation frequency of an artificial pin than LuBCO. It is considered that YbBCO has a nucleation frequency of an artificial pin of about seven times LuBCO. The ionic radius of ytterbium (Yb) is larger than that of lutetium (Lu).

It is considered that the nucleation frequency is determined by a difference between the ionic radius of MA and the ionic radius of CA. It is considered that a small difference between the ionic radius of CA and the ionic radius of MA increases a nucleation frequency, and a large difference between the ionic radius of CA and the ionic radius of MA reduces a nucleation frequency.

In the present embodiment, by containing two kinds of CAs having different ionic radii, it is possible to realize an intermediate nucleation frequency between the nucleation frequencies realized by the respective CAs alone. Therefore, it is possible to realize an artificial pin having an intermediate size between the sizes of artificial pins realized by the two kinds of CAs alone.

For example, when the oxide superconductor layer 30 contains ytterbium (Yb) and lutetium (Lu) as CA, it is possible to realize a nucleation frequency higher than a case where only lutetium (Lu) is contained as CA and lower than a case where only ytterbium (Yb) is contained as CA. Therefore, it is possible to form an artificial pin larger than a case where only lutetium (Lu) is contained as CA and smaller than a case where only ytterbium (Yb) is contained as CA.

Preferably, the second element is at least one selected from the group consisting of neodymium (Nd) and samarium (Sm), the third element is at least one selected from the group consisting of yttrium (Y), dysprosium (Dy), and holmium (Ho), and the fourth element is formed of at least two selected from the group consisting of erbium (Er), thulium (Tm), and ytterbium (Yb). More preferably, the second element is samarium (Sm), the third element is at least one selected from the group consisting of yttrium (Y) and holmium (Ho), and the fourth element is formed of at least two selected from the group consisting of erbium (Er) and thulium (Tm). A smaller difference in an ionic radius between MA and CA makes a nucleation frequency of CARP higher. Therefore, CARP having a small size is formed, and a magnetic field characteristic in a low temperature region is further improved.

According to the present embodiment, an oxide superconductor capable of controlling the size of an artificial pin and improving a magnetic field characteristic in a specific temperature region, and a method for manufacturing the same are realized.

Fifth Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least two second elements selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

In a method for manufacturing the oxide superconductor of the present embodiment, first, an aqueous solution containing an acetate of a first element which is praseodymium (Pr), an acetate of at least two second elements selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), and an acetate of at least one fourth element selected from the group consisting of erbium (Er), thulium (Tm), ytterbium (Yb), and lutetium (Lu), an acetate of barium (Ba), and an acetate of copper (Cu) is prepared. Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel.

Subsequently, an alcohol containing methanol is added to the second gel and is dissolved therein to prepare a coating solution in which a total weight of residual water and residual acetic acid is 2% by weight or less, and the coating solution is applied on a substrate to form a gel film. Subsequently, the gel film is subjected to calcining at 400° C. or lower to form a calcined film. Subsequently, the calcined film is subjected to firing under a humidified atmosphere at 725° C. or higher and 850° C. or lower and oxygen annealing to form the oxide superconductor layer (oxide superconductor film) 30.

The oxide superconductor of the present embodiment is different from the fourth embodiment in that at least two kinds of SAs as second elements are added to the oxide superconductor layer 30. Hereinafter, description of matters overlapping with the fourth embodiment is omitted.

In the present embodiment, the oxide superconductor layer 30 contains at least one kind of PA, at least two kinds of SAs, at least one kind of MA, and at least one kind of CA. For example, PA is praseodymium (Pr), SAs are samarium (Sm) and europium (Eu), MA is yttrium (Y), and CA is ytterbium (Yb).

For example, in the present embodiment, the oxide superconductor layer 30 contains samarium (Sm) and europium (Eu) having different ionic radii as SA. By containing two kinds of SAs having different ionic radii, the size of an artificial pin is controlled. The ionic radius of samarium (Sm) is larger than that of europium (Eu).

It is considered that the nucleation frequency is determined by a difference between the ionic radius of MA and the ionic radius of SA. It is considered that a small difference between the ionic radius of SA and the ionic radius of MA increases a nucleation frequency, and a large difference between the ionic radius of SA and the ionic radius of MA reduces a nucleation frequency.

In the present embodiment, by containing two kinds of SAs having different ionic radii, it is possible to realize an intermediate nucleation frequency between the nucleation frequencies realized by the respective SAs alone. Therefore, it is possible to realize an artificial pin having an intermediate size between the sizes of artificial pins realized by the two kinds of SAs alone.

For example, when the oxide superconductor layer 30 contains samarium (Sm) and europium (Eu) as SA, it is possible to realize a nucleation frequency higher than a case where only samarium (Sm) is contained as SA and lower than a case where only europium (Eu) is contained as SA. Therefore, it is possible to form an artificial pin larger than a case where only samarium (Sm) is contained as SA and smaller than a case where only europium (Eu) is contained as SA.

According to the present embodiment, an oxide superconductor capable of controlling the size of an artificial pin and improving a magnetic field characteristic in a specific temperature region, and a method for manufacturing the same are realized.

Sixth Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of gadolinium (Gd), yttrium (Y), terbium (Tb), dysprosium (Dy), and holmium (Ho), and at least two third elements selected from the group consisting of erbium (Er), thulium (Tm), ytterbium (Yb), and lutetium (Lu).

The oxide superconductor of the present embodiment is different from that in the third embodiment in that an oxide superconductor layer 30 contains no supporting atom (SA) in the third embodiment. Hereinafter, description of matters overlapping with the third embodiment is omitted.

The oxide superconductor layer 30 in the present embodiment contains a third generation type clustered atom-replaced artificial pin (third CARP).

The oxide superconductor layer 30 in the present embodiment is formed of PA, MA, and CA. The first element is a pinning atom (PA), the second element is a matrix atom (MA), and the third element is a counter atom (CA).

For example, in the present embodiment, the oxide superconductor layer 30 contains ytterbium (Yb) and lutetium (Lu) having different ionic radii as CA. By containing two kinds of CAs having different ionic radii, the size of an artificial pin is controlled.

In the present embodiment, by containing two kinds of CAs having different ionic radii, it is possible to realize an intermediate nucleation frequency between the nucleation frequencies realized by the respective CAs alone. Therefore, it is possible to realize an artificial pin having an intermediate size between the sizes of artificial pins realized by the two kinds of CAs alone.

For example, when the oxide superconductor layer 30 contains ytterbium (Yb) and lutetium (Lu) as CA, it is possible to realize a nucleation frequency higher than a case where only lutetium (Lu) is contained as CA and lower than a case where only ytterbium (Yb) is contained as CA. Therefore, it is possible to form an artificial pin larger than a case where only lutetium (Lu) is contained as CA and smaller than a case where only ytterbium (Yb) is contained as CA.

According to the present embodiment, an oxide superconductor capable of controlling the size of an artificial pin and improving a magnetic field characteristic in a specific temperature region is realized. Furthermore, SA for forming a superconducting unit cell in an artificial pin is not contained, and a magnetic field characteristic is thereby improved.

Seventh Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), a second element which is samarium (Sm), at least one third element selected from the group consisting of yttrium (Y) and holmium (Ho), and a fourth element which is thulium (Tm).

The oxide superconductor of the present embodiment is different from that in the first embodiment particularly in that SA as a second element is limited to samarium (Sm), MA as a third element is limited to yttrium (Y) or holmium (Ho), and CA as a fourth element is limited to thulium (Tm). In addition, the oxide superconductor of the present embodiment is different from that in the first embodiment in not necessarily containing SA or CA excessively. Hereinafter, matters overlapping with the first embodiment are omitted.

In the present embodiment, a relatively small difference between an ionic radius of MA and an ionic radius of CA makes a nucleation frequency high. Therefore, the size of an artificial pin is reduced, and an oxide superconductor having an excellent magnetic field characteristic particularly in a low temperature region can be achieved.

Hereinafter, functions and effects of the present embodiment are described, and a CARP forming model is also described.

For example, a case of application to a power transmission cable or a current limiter requires improvement of a magnetic field characteristic in a temperature region of 77 K to 50 K. On the other hand, for example, a case of application to a heavy particle beam cancer treatment apparatus or a magnetically levitated train requires improvement of a magnetic field characteristic around 30 K. Therefore, improvement of a magnetic field characteristic in a low temperature region is also required.

In order to make an effect as an artificial pin exhibited in a low temperature region, it is necessary to reduce the size of an artificial pin. Therefore, when CARP is used as an artificial pin, it is necessary to reduce the size of CARP. In order to reduce the size of CARP, it is necessary to find the size of CARP currently used, and to control the size so as to be small. However, it is difficult to find the size of CARP.

A $BaZrO_3$ artificial pin which was developed in the past has a different lattice constant from YBCO in a matrix phase, therefore has a separated structure, and has a clear interface. Therefore, it is easy to specify a position of BZO. Therefore, it is also easy to find the size.

However, CARP has a completely different structure from conventional BZO, and a part of a continuous Perovskite structure forms an artificial pin. Therefore, even by TEM observation, it is difficult to determine whether a structure is CARP or a YBCO superconductor, and it is extremely difficult to observe the size of CARP directly.

It is difficult to observe the size of CARP directly. However, a sample has obtained a small effect for improving a magnetic field characteristic using a pin size control technology at a temperature of 30 K at a magnetic field of 1 T to 3 T. Considering the size based on a prior report example, the size of an artificial pin in this sample is estimated to be about from 15 nm to 20 nm. Therefore, the size of CARP is analogized to be about from 15 nm to 20 nm.

A position in which CARP is present is analogized from fluctuation of a position of a Cu atom which can be observed by TEM, or the like, and there is a high possibility that CARP is distributed in a lump shape in the whole of a film. The lump-shaped CARP is distributed in the film substantially uniformly, and it is estimated that the CARP has a diameter of 15 nm to 20 nm. Therefore, if a CARP forming model (CARP growth model) can be understood, the size of CARP can be controlled by application of the model.

PA, SA, and CA are assembled by a clustering phenomenon, PA makes four adjacent unit cells in an a/b plane non-superconductive, and the above CARP is thereby formed. It is estimated that the whole of CARP functions as an artificial pin. In order to control the size of CARP, it is necessary to find a unit cell serving as a starting point to form CARP.

There is a high possibility that the starting point to form CARP is CA. In a Perovskite structure of YBCO, there is a correlation between an ionic radius of an element to enter a Y site and an optimal oxygen partial pressure at the time of film formation. The optimal oxygen partial pressure is a value at which a Jc value of a resulting superconductor is the largest in liquid nitrogen. In addition, the oxygen partial pressure has a reverse correlation with an ionic radius.

For example, LaBCO has an optimal oxygen partial pressure of 0.2 ppm, NdBCO has an optimal oxygen partial pressure of 5 ppm, and SmBCO has an optimal oxygen partial pressure of 20 ppm. The size of an ionic radius is indicated by La>Nd>Sm>Y>Tm>Yb>Lu. YBCO has an optimal oxygen partial pressure of 1000 ppm. It is considered that TmBCO, YbBCO, and LuBCO have optimal oxygen partial pressures of about 2000 ppm, 3000 ppm, and 4000 ppm, respectively although exact values thereof are not clear.

It is considered that a difference in an effective ionic radius between elements is determined by a logarithmical difference from an optimal oxygen partial pressure of YBCO. As for a difference from an optimal oxygen partial pressure of YBCO, an optimal oxygen partial pressure of SmBCO to constitute CARP is 1/50 of YBCO, that is there is a difference of 50 times. TmBCO has a difference of two times, YbBCO has a difference of three times, and LuBCO has a difference of four times. There is no data for PrBCO, but the data is between La and Nd, and is estimated to be from 0.2 ppm to 5 ppm, but is considered to be about 1 ppm. CA has the smallest difference in an effective ionic radius from YBCO. As a difference in an ionic radius is smaller, a nucleation frequency should be relatively higher, and there is a high possibility that the starting point to grow CARP is CA. PA or SA has a lower nucleation frequency than CA.

An important factor to determine the size of CARP is a nucleation frequency in MA and CA. When a nucleation frequency in CA is 1/1000000 of MA, one CA is grown with respect to 1000000 MAs, and surrounding elements to constitute CARP are assembled. These elements form CARP. Provisionally, it is assumed that one CA is grown with respect to 1000000 MAs at CA=Lu. At this time, when Tm having a nucleation frequency of 100 times of Lu for CA, 100 CAs, that is, 100 Tms are nucleus-generated with respect to 1000000 MAs.

Figure 8A:
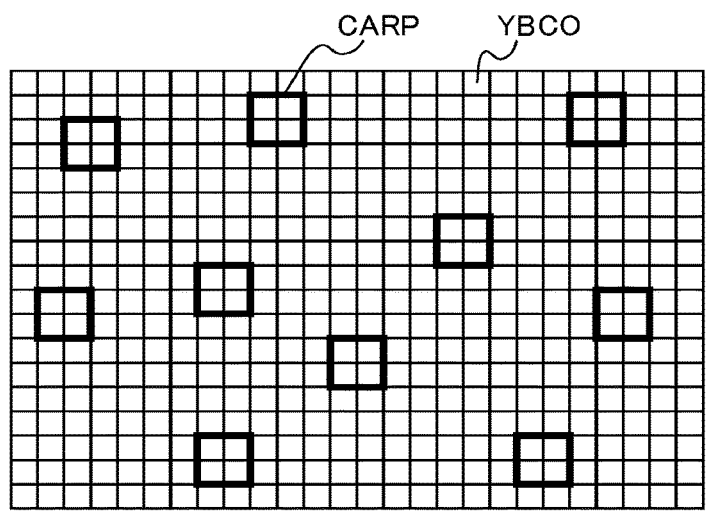
FIGS. 8A and 8B are diagrams illustrating functions and effects of a seventh embodiment.
Figure 8B:
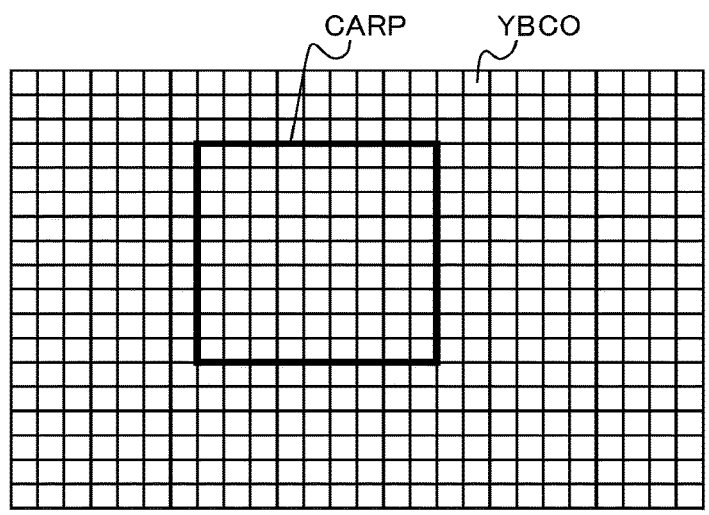

FIGS. 8A and 8B are diagrams illustrating functions and effects of the seventh embodiment. FIGS. 8A and 8B are diagrams schematically illustrating a difference in growth of CARP when CAs having different ionic radii are applied.

FIG. 8A illustrates a case where CA is Tm. FIG. 8B illustrates a case where CA is Yb. Tm has a smaller difference in an ionic radius from Y than Yb. Therefore, a difference between a unit cell size of TmBCO and a unit cell size of YBCO is smaller than a difference between a unit cell size of YbBCO and a unit cell size of YBCO, and makes a nucleation frequency larger. In a case of Tm having a larger nucleation frequency than Yb, if elements to constitute CARP are present at the same density, more CARPs are formed than in a case of Yb, and the size of CARP, that is, an average diameter of CARP is reduced.

Once nucleation occurs, it is considered that CARP is grown preferentially and becomes larger as long as elements to constitute CARP are supplied from surroundings. However, for example, the elements to constitute CARP occupy only about 8% of the whole. When the elements to constitute CARP are used, a concentration of the elements to constitute CARP present therearound is reduced, and a possibility of growth of YBCO is increased. Once YBCO is grown, the same unit cell YBCO is easily grown in an adjacent cell. At this time, CARP which has been grown is surrounded by YBCO which is MA, and becomes a lump shape. A CARP growth model which is clear at present has been described above.

From the above model, it is estimated that CARP formed at Pr:Sm:Yb=1:1:2, having the same size is formed even when the amount of elements to constitute CARP becomes twice. It is assumed that sample 1 at Pr:Sm:Yb=1:1:2(%) and sample 2 at Pr:Sm:Yb=2:2:4 are film-formed. The Yb nucleation amount of the latter is twice that of the former, and therefore the number of CARP in the same volume is twice. A region which can include elements to constitute CARP is 1/2. However, the concentration of elements to constitute CARP in the region is twice, and therefore the size of CARP having the same amount is obtained as a result. Furthermore, in general, even in a case of n times of 1:1:2, the same result is obtained. When films having the same ratio of PA:SA:CA but different total amounts are formed, the size is the same but only the number of CARP is increased.

In the above case, for example, when only CA is increased from PA:SA:CA=1:1:2 to obtain PA:SA:CA=1:1:10, the volume of elements to constitute CARP is the same (CA excess amount 8 does not form CARP), but the nucleation number is five times the number before increase. That is, CARP is formed in an amount five times the amount of conventional CA. This is a CARP forming model which is clear at present.

Particularly effective means for reducing the size of CARP are (1) increase only in CA and (2) use of CA having a higher nucleation frequency. When the nucleation number is increased, the final size of CARP is determined by the amount of elements to constitute CARP. The size of CARP in the current CARP growth model can be described as follows.

$$D(CP)=k \times M(CP) \times V(MA)/V(CA)$$

In the above formula, the signs are defined as follows.

D(CP): average diameter of CARP (Diameter of CARP)
M(CP): molar number per unit volume of elements to constitute CARP (Mass of CARP)
V(MA): nucleation velocity (frequency) of MA (Velocity of MA nucleation)
V(CA): nucleation velocity (frequency) of CA (Velocity of CA nucleation)
k: constant in CARP growth model (CARP constant)

Hereinafter, Examples are described.

EXAMPLES

In the following Examples, a solution or a superconductor having a Perovskite structure is formed by mixing many metal acetates. In a Y-based superconductor having a Perovskite structure, Y or an element in a lanthanoid group is present in a Y site (rare earth site), and Ba and Cu are present in the other sites. A ratio thereamong is about 1:2:3. Therefore, by paying attention to a metal element used in the Y site, description is made as follows.

In the following Example, at least four kinds of elements (at least three kinds of elements in a part) are necessary as an element in the Y site. These are PA for generating an artificial pin, SA for assisting PA, MA for acting as a matrix phase, and finally CA necessary for forming a cluster, having a small ionic radius. Only Pr can be used for PA. Nd, Sm, Eu, and Gd can be used for SA. Tb, Dy, Ho, and Y can be used for MA. Er, Tm, Yb, and Lu can be used for CA. In a case of the third CARP, Gd can be used also as a part of MA.

When three kinds of rare earth elements are contained, SA is not used. In this case, Gd can be used for MA. Only Pr can be used for PA. However, a cluster is formed by adding Y or the like to Gd for MA, and a cluster is formed with Tm or the like for CA.

In the following Example, an element is described in the order of a lanthanoid group element having a smaller atomic number, and is described in the order of PA, SA, MA, and CA. When Y is used for MA, Y is described in the end. PA+SA, MA, and CA are joined with a bar. For example, a case where MA=Y is satisfied and Pr, Sm, and Lu are mixed at 4%, 4%, and 8%, respectively, is described as 4% Pr4% Sm—Y-8% Lu.

However, in the following two cases, description of a ratio among elements can be omitted. These are cases of PA=SA and CA=2×PA. A clustering technique is often argued based on PA=SA and PA+SA=CA, and therefore such a method of omitting description is used.

For example, a case where MA=Y is satisfied and Pr, Sm, and Lu are 2%, 2%, and 10%, respectively, can be described as 2% PrSm—Y-10% Lu. A case where Pr, Sm, and Lu are 2%, 6%, and 4%, respectively, can be described as 2% Pr6% Sm—Y—Lu. A case where Pr, Sm, and Lu are 2%, 2%, and 4%, respectively, can be described as 2% PrSm—Y—Lu.

In order to examine the improvement degree of a magnetic field characteristic, a characteristic improvement ratio Eff (X, T, B1, B2) is defined as follows while YBCO containing no CARP is used as a reference sample.

$$Eff(X,T,B1,B2)=[Jc(X,T,B2)/Jc(YBCO,T,B2)]/[Jc(X,T,B1)/Jc(YBCO,T,B1)]$$

For example, a characteristic improvement ratio of a superconducting film 1FS-1% PrSm—Y-10% Lu at 77 K in 1 T→5 T can be written as follows.

Eff (1FS-1% PrSm—Y-10% Lu, 77 K, 1 T, 5 T)=[Jc(1FS-1% PrSm—Y-10% Lu, 77 K, 5 T)/Jc(YBCO, 77 K, 5 T)]/[Jc(1FS-1% PrSm—Y-10% Lu, 77 K, 1 T)/Jc(YBCO, 77 K, 1 T)] is satisfied, and this value is 2.028. The following Example evaluates presence of characteristic improvement based on the above definition.

Example 1

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 1Mi-1% PrSm—Y—Lu (substance described in Example 1, Y-based material with impurity) was obtained.

Similarly, powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.01:0.01:0.88:0.10:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 1Mi-1% PrSm—Y-10% Lu was obtained.

Each of the obtained semitransparent blue substances 1Mi-1% PrSm—Y—Lu and 1Mi-1% PrSm—Y-10% Lu contained water or acetic acid as a byproduct of a reaction at the time of synthesis of a solution in an amount of about 7 wt %.

The obtained semitransparent blue substances 1Mi-1% PrSm—Y—Lu and 1Mi-1% PrSm—Y-10% Lu were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 1M-1% PrSm—Y—Lu (substance described in Example 1, Y-based material without impurity) and 1M-1% PrSm—Y-10% Lu, respectively.

The semitransparent blue substances 1M-1% PrSm—Y—Lu and 1M-1% PrSm—Y-10% Lu were each dissolved in methanol (j in FIG. 3), and were diluted using a measuring flask to obtain 1.50 mol/l coating solutions 1Cs-1% PrSm—Y—Lu(Example 1, coating solution for Y-based superconductor) and 1Cs-1% PrSm—Y-10% Lu in terms of a metal ion, respectively.

The coating solutions 1Cs-1% PrSm—Y—Lu and 1Cs-1% PrSm—Y-10% Lu were mixed with each other at a ratio of 7:1, 6:2, 4:4, or 2:6 to obtain coating solutions 1Cs-1% PrSm—Y-3% Lu, 1Cs-1% PrSm—Y-4% Lu, 1Cs-1% PrSm—Y-6% Lu, and 1Cs-1% PrSm—Y-8% Lu.

A film was formed by using the coating solutions 1Cs-1% PrSm—Y—Lu, 1Cs-1% PrSm—Y-3% Lu, 1Cs-1% PrSm—Y-4% Lu, 1Cs-1% PrSm—Y-6% Lu, 1Cs-1% PrSm—Y-8% Lu, and 1Cs-1% PrSm—Y-10% Lu by a spin coating method at a maximum rotation number of 2000 rpm.

Subsequently, calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower. The superconducting films 1FS-1% PrSm—Y—Lu (Example 1, Y-based film of superconductor), 1FS-1% PrSm—Y-3% Lu, 1FS-1% PrSm—Y-4% Lu, 1FS-1% PrSm—Y-6% Lu, 1FS-1% PrSm—Y-8% Lu, and 1FS-1% PrSm—Y-10% Lu were obtained.

The superconducting films 1FS-1% PrSm—Y—Lu, 1FS-1% PrSm—Y-3% Lu, 1FS-1% PrSm—Y-4% Lu, 1FS-1% PrSm—Y-6% Lu, 1FS-1% PrSm—Y-8% Lu, and 1FS-1% PrSm—Y-10% Lu were measured by a 2θ/w method in XRD measurement, and it was confirmed that a peak was obtained at approximately the same position as a YBCO (00n) peak.

FIG. 2 illustrates a result of XRD measurement of the superconducting films 1FS-1% PrSm—Y—Lu and 1FS-1% PrSm—Y-10% Lu. In FIG. 2, 1FS-1% PrSm—Y—Lu is indicated by a dotted line, and a second 1FS-1% PrSm—Y-10% Lu is indicated by a solid line.

In 1FS-1% PrSm—Y—Lu in FIG. 2, a small different phase of a BaCu-based complex oxide is observed, but approximately the same peaks as the single peaks of YBCO (00n) are observed, and each of the peaks is one peak without being separated. A YBCO (006) peak at 2θ=46.68 degrees indicates this clearly. In addition, an intensity is sufficiently strong, and it is estimated that all the materials form a continuous Perovskite structure. That is, this indicates that PrBCO, SmBCO, and LuBCO are incorporated into a Perovskite structure of YBCO in this system.

FIG. 2 indicates that the other superconducting film 1FS-1% PrSm—Y-10% Lu has approximately the same peaks and intensity as 1FS-1% PrSm—Y—Lu. This system contains LuBCO excessively by 8%, and FIG. 2 indicates that LuBCO is incorporated into a Perovskite structure. That is, it can be estimated that the structure obtained in Example 1 is a structure in which only CARP has become smaller while a continuous Perovskite structure is maintained as illustrated in FIG. 1B.

The superconducting films 1FS-1% PrSm—Y—Lu, 1FS-1% PrSm—Y-3% Lu, 1FS-1% PrSm—Y-4% Lu, 1FS-1% PrSm—Y-6% Lu, 1FS-1% PrSm—Y-8% Lu, and 1FS-1% PrSm—Y-10% Lu were each disposed in liquid nitrogen, and a superconducting characteristic thereof was measured under a self-magnetic field by an induction method. Jc values were 6.3, 6.4, 6.3, 6.1, 6.0, and 6.2 MA/cm$^2$ (77 K, 0 T), respectively. It is considered that these Jc values are relatively satisfactory. A 5 times degradation phenomenon caused by ultimate dispersion of PrBCO is not easily confirmed because of corresponding to 5% degradation of a Jc value in the above samples. However, if clustering occurs, an effect is confirmed by Jc-B measurement.

Figure 9:
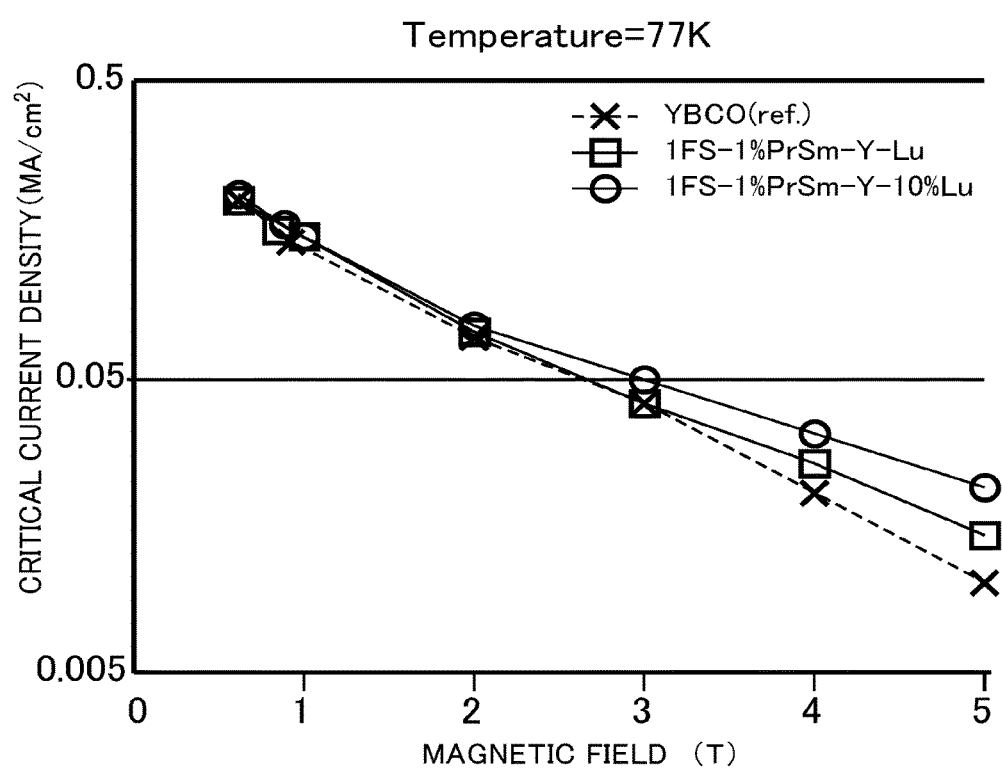
FIG. 9 is a diagram illustrating a result of Jc-B measurement in Example 1.

FIG. 9 is a diagram illustrating a result of Jc-B measurement in Example 1. FIG. 8 illustrates a result of measuring a Jc value of each of the superconducting films 1FS-1% PrSm—Y—Lu and 1FS-1% PrSm—Y-10% Lu in a magnetic field of 1 to 5 T at 77 K. FIG. 8 also illustrates a measurement result in a case of a YBCO superconductor as a reference sample. The horizontal axis of FIG. 8 indicates a magnetic field using T as a unit, and the vertical axis thereof indicates a Jc value and is a logarithmic axis.

The graph indicates that the superconducting film 1FS-1% PrSm—Y—Lu has a higher characteristic than a YBCO superconductor at 2 T, and has a still higher characteristic at 5 T. The characteristic of the superconducting film 1FS-1% PrSm—Y-10% Lu becomes higher than the characteristic of the YBCO superconductor as a reference sample at 2 T similarly, and becomes still higher at 4 T or 5 T. The above result indicates that a magnetic field characteristic has been improved by adding lutetium excessively.

Figure 10:
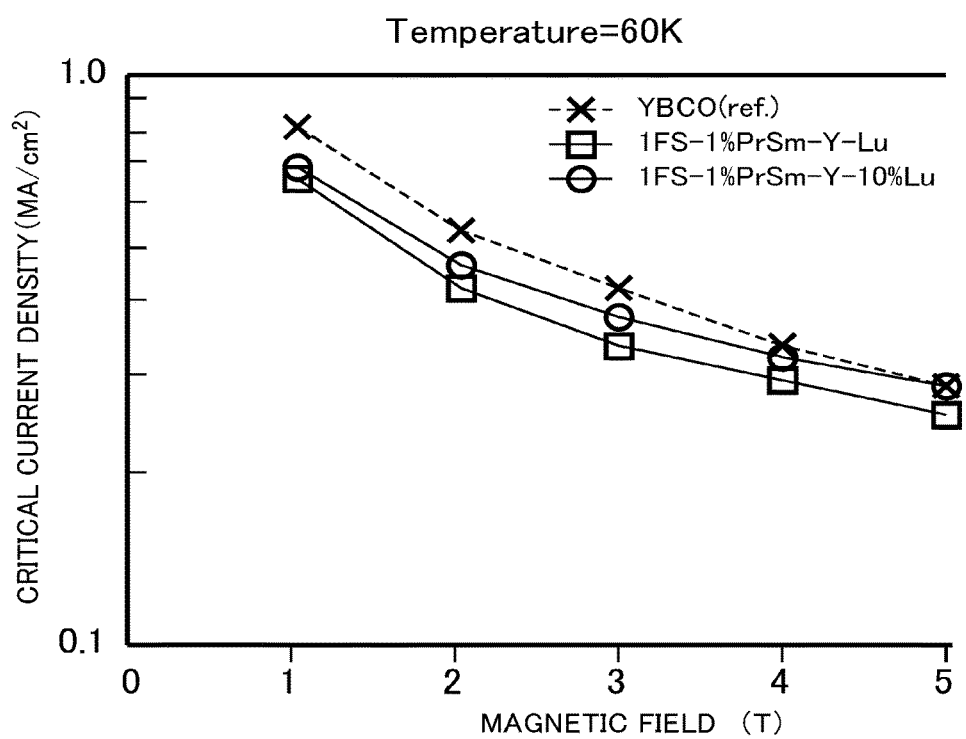
FIG. 10 is a diagram illustrating a result of Jc-B measurement in Example 1.

FIG. 10 is a diagram illustrating a result of Jc-B measurement in Example 1. FIG. 9 illustrates a result of measuring a Jc value of each of the superconducting films 1FS-1% PrSm—Y—Lu and 1FS-1% PrSm—Y-10% Lu in a magnetic field of 1 to 5 T at 60 K. The horizontal axis of FIG. 8 indicates a magnetic field using T as a unit, and the vertical axis thereof indicates a Jc value and is a logarithmic axis. The Jc-B characteristic of the superconducting film 1FS-1% PrSm—Y—Lu was generally slightly lower than that of the YBCO superconductor as a reference sample.

A characteristic improvement ratio was examined, and Eff (1FS-1% PrSm—Y—Lu, 60 K, 1 T, 5 T), Eff (1FS-1% PrSm—Y-3% Lu, 60 K, 1 T, 5 T), Eff (1FS-1% PrSm—Y-4% Lu, 60 K, 1 T, 5 T), Eff (1FS-1% PrSm—Y-6% Lu, 60 K, 1 T, 5 T), Eff (1FS-1% PrSm—Y-8% Lu, 60 K, 1 T, 5 T), and Eff (1FS-1% PrSm—Y-10% Lu, 60 K, 1 T, 5 T) were 1.074, 1.112, 1.127, 1.133, 1.146, and 1.152, respectively. It has been found that an effect of improvement of a magnetic field characteristic is observed slightly with respect to the YBCO superconductor as a reference sample.

The superconducting film 1FS-1% PrSm—Y-10% Lu exhibits a result close to a superconducting characteristic of 1FS-1% PrSm—Y—Lu at 1 T. 1FS-1% PrSm—Y-10% Lu has a better characteristic as the magnetic field is higher, and has a result approximately the same as the YBCO superconductor at 5 T.

It is considered that this result indicates that a nucleation frequency is increased by increasing the content of Lu from 2% to 10%, the size of an artificial pin is reduced, and an effect of improvement of a magnetic field characteristic is exhibited at a lower temperature.

Figure 11:
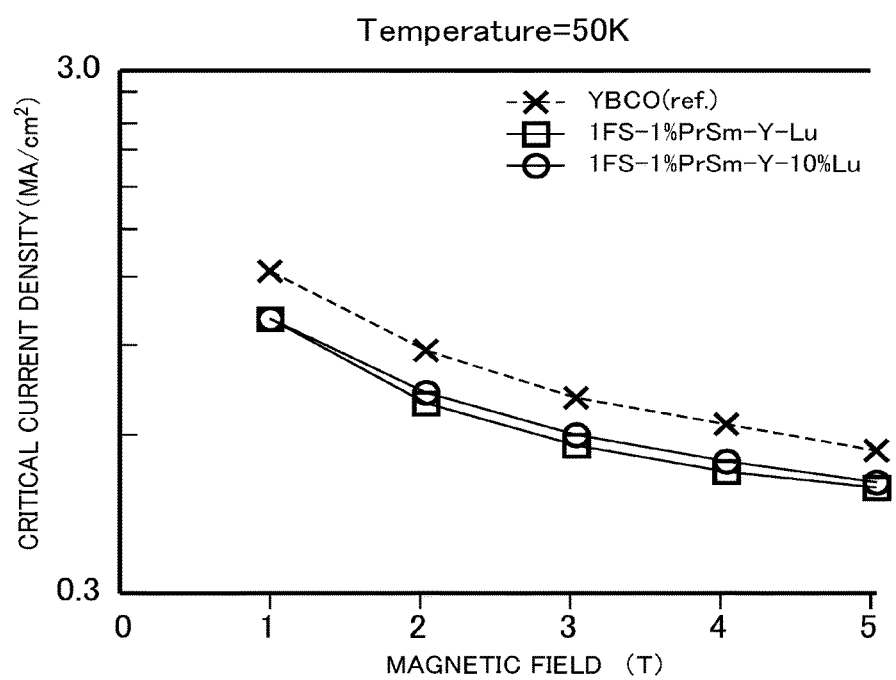
FIG. 11 is a diagram illustrating a result of Jc-B measurement in Example 1.

FIG. 11 is a diagram illustrating a result of Jc-B measurement in Example 1. FIG. 10 illustrates a result of measuring a Jc value of each of the superconducting films 1FS-1% PrSm—Y—Lu and 1FS-1% PrSm—Y-10% Lu in a magnetic field of 1 to 5 T at 50 K. This result indicates a characteristic difference between 1FS-1% PrSm—Y—Lu and 1FS-1% PrSm—Y-10% Lu is small.

A characteristic improvement ratio was examined, and Eff (1FS-1% PrSm—Y—Lu, 50 K, 1 T, 5 T), Eff (1FS-1% PrSm—Y-3% Lu, 50 K, 1 T, 5 T), Eff (1FS-1% PrSm—Y-4% Lu, 50 K, 1 T, 5 T), Eff (1FS-1% PrSm—Y-6% Lu, 50 K, 1 T, 5 T), Eff (1FS-1% PrSm—Y-8% Lu, 50 K, 1 T, 5 T), and Eff (1FS-1% PrSm—Y-10% Lu, 50 K, 1 T, 5 T) were 1.086, 1.098, 1.092, 1.095, 1.101, and 1.106, respectively. It cannot be determined that there is no effect of improvement of a magnetic field characteristic because of Eff of one or more, but a clear effect is not observed. There is a possibility that the size of an artificial pin was not appropriate in this temperature region.

The above result can be understood as follows. It is considered that CARP of the superconducting film 1FS-1% PrSm—Y—Lu is formed as illustrated in FIG. 7. A stoichiometric ratio at which assembling is possible in a CARP portion is used as a quantitative ratio among Pr, Sm, and Lu which are elements to be added. Therefore, it is considered that Pr, Sm, or Lu is hardly present in portions other than CARP.

Meanwhile, it is considered that CARP of the superconducting film 1FS-1% PrSm—Y-10% Lu is formed as illustrated in FIG. 1B. Lu is present excessively, and therefore a nucleation frequency is increased proportionally with the excessive amount. That is, it is considered that the nucleation frequency has become five times because the content of Lu has become five times. When the amount of nucleation becomes five times the usual amount, the volume of CARP also becomes 1/5. However, it is considered that CARP has a flat coin shape, and it is considered that the radius of CARP has become about 1/2.236.

It is considered that a nucleation frequency of SA or CA with respect to MA is involved in conditions for forming CARP.

It is considered that the superconducting film 1FS-1% PrSm—Y-10% Lu is obtained due to formation of smaller CARP by controlling the nucleation frequency. It is considered that the second CARP is a wire material which has a small inner bypass current (IBC) and is not easily quenched when a coil is formed. Example 1 has been able to provide a superconducting material capable of controlling the pin size of the second CARP so as to have a small size while Tc is maintained.

Example 2

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 2Mi-1% PrSm—Y—Lu (substance described in Example 2, Y-based material with impurity) was obtained.

Similarly, powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.01:0.10:0.88:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 2Mi-1% Pr10% Sm—Y—Lu was obtained. The content of Lu in this substance was 2%, twice the content of Pr by the definition of description.

Each of the obtained semitransparent blue substances 2Mi-1% PrSm—Y—Lu and 2Mi-1% Pr10% Sm—Y—Lu contained water or acetic acid as a byproduct of a reaction at the time of synthesis of a solution in an amount of about 7 wt %.

The obtained semitransparent blue substances 2Mi-1% PrSm—Y—Lu and 2Mi-1% Pr10% Sm—Y—Lu were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 2M-1% PrSm—Y—Lu (substance described in Example 2, Y-based material without impurity) and 2M-1% PrSm—Y-10% Lu, respectively.

The semitransparent blue substances 2M-1% PrSm—Y—Lu and 2M-1% Pr10% Sm—Y—Lu were each dissolved in methanol (j in FIG. 3), and were diluted using a measuring flask to obtain 1.50 mol/l coating solutions 2Cs-1% PrSm—Y—Lu (Example 2, coating solution for Y-based superconductor) and 2Cs-1% Pr10% Sm—Y—Lu in terms of a metal ion, respectively.

The coating solutions 2Cs-1% PrSm—Y—Lu and 2Cs-1% Pr10% Sm—Y—Lu were mixed with each other at a ratio of 8:1, 6:3, 4:5, or 2:7 to obtain coating solutions 2Cs-1% Pr2% Sm—Y—Lu, 2Cs-1% Pr4% Sm—Y—Lu, 2Cs-1% Pr6% Sm—Y—Lu, and 2Cs-1% Pr8% Sm—Y—Lu.

A film was formed by using the coating solutions 2Cs-1% PrSm—Y—Lu, 2Cs-1% Pr2% Sm—Y—Lu, 2Cs-1% Pr4% Sm—Y—Lu, 2Cs-1% Pr6% Sm—Y—Lu, 2Cs-1% Pr8% Sm—Y—Lu, and 2Cs-1% Pr10% Sm—Y—Lu by a spin coating method at a maximum rotation number of 2000 rpm.

Subsequently, calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower. The superconducting films 2FS-1% PrSm—Y—Lu (Example 2, Y-based film of superconductor), 2FS-1% Pr2% Sm—Y—Lu, 2FS-1% Pr4% Sm—Y—Lu, 2FS-1% Pr6% Sm—Y—Lu, 2FS-1% Pr8% Sm—Y—Lu, and 2FS-1% Pr10% Sm—Y—Lu were obtained.

The superconducting films 2FS-1% PrSm—Y—Lu, 2FS-1% Pr2% Sm—Y—Lu, 2FS-1% Pr4% Sm—Y—Lu, 2FS-1% Pr6% Sm—Y—Lu, 2FS-1% Pr8% Sm—Y—Lu, and 2FS-1% Pr10% Sm—Y—Lu were measured by a 2θ/ω method in XRD measurement, and it was confirmed that a peak was obtained at approximately the same position as a YBCO (00n) peak. This result indicates that PrBCO, SmBCO, and LuBCO have been formed in a Perovskite structure continuous to YBCO.

The superconducting films 2FS-1% PrSm—Y—Lu, 2FS-1% Pr2% Sm—Y—Lu, 2FS-1% Pr4% Sm—Y—Lu, 2FS-1% Pr6% Sm—Y—Lu, 2FS-1% Pr8% Sm—Y—Lu, and 2FS-1% Pr10% Sm—Y—Lu were each disposed in liquid nitrogen, and a superconducting characteristic thereof was measured under a self-magnetic field by an induction method. Jc values were 6.3, 6.5, 6.4, 6.8, 7.1, and 7.3 $MA/cm^2$ (77 K, 0 T), respectively. The Jc values were slightly higher values probably by an influence of Sm, but were satisfactory. A 5 times degradation phenomenon caused by ultimate dispersion of PrBCO corresponds to 5% degradation of a Jc value in the above samples. However, the phenomenon has not been confirmed. However, if clustering occurs to generate an artificial pin, an effect is confirmed by Jc-B measurement.

Presence of an effect for improving a characteristic was examined using a characteristic improvement ratio Eff (X, T, B1, B2). Eff (2FS-1% PrSm—Y—Lu, 77 K, 1 T, 5 T), Eff(2FS-1% Pr2% Sm—Y—Lu, 77 K, 1 T, 5 T), Eff(2FS-1% Pr4% Sm—Y—Lu, 77 K, 1 T, 5 T), Eff(2FS-1% Pr6% Sm—Y—Lu, 77 K, 1 T, 5 T), Eff(2FS-1% Pr8% Sm—Y—Lu, 77 K, 1 T, 5 T), and Eff(2FS-1% Pr10% Sm—Y—Lu, 77 K, 1 T, 5 T) were 1.501, 1.662, 1.723, 1.775, 1.799, and 1.832, respectively. It has been found that an effect of improvement of a magnetic field characteristic is observed with respect to the YBCO superconductor as a reference sample when the content of Sm is twice or more a difference between the content of CA and the content of PA.

It is also considered that Sm enters a cluster portion with more priority than Pr by increase in the content of Sm. The experimental result indicates that Sm and Pr are incorporated into the cluster portion while Sm:Pr=1:1 is maintained and the increased amount of Sm is involved in nucleation increase. It has been found that the nucleation frequency of an artificial pin is increased by increasing not only CA but also SA.

In addition, it is considered that the nucleation frequency is increased by adding SA excessively to reduce the size of an artificial pin. Therefore, it is considered that a magnetic field characteristic is improved compared with a case where SA is not excessively added in a temperature region lower than 77 K, particularly at 70 K or 60 K. It is considered that a characteristic is improved at a lower temperature side in a system in which the nucleation frequency is higher, particularly in a system using Tm or the like for CA.

Example 3

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Gd(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.01:0.01:0.48:0.48:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 3Mi-1% PrSm—GdY—Yb (substance described in Example 3, GdY-based material with impurity) was obtained.

Similarly, powdery hydrates of $Pr(OCOCH_3)_3$, $Sm(OCOCH_3)_3$, $Y(OCOCH_3)_3$, $Gd(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.01:0.01:0.44:0.44:0.10:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 3Mi-1% PrSm—GdY-10% Yb was obtained.

Each of the obtained semitransparent blue substances 3Mi-1% PrSm—GdY—Yb and 3Mi-1% PrSm—GdY-10% Yb contained water or acetic acid as a byproduct of a reaction at the time of synthesis of a solution in an amount of about 7 wt %.

The obtained semitransparent blue substances 3Mi-1% PrSm—GdY—Yb and 3Mi-1% PrSm—GdY-10% Yb were each completely dissolved in methanol having a weight about 100 times each of the substances (f in FIG. 3). The solutions were subjected to a reaction and purification again in a rotary evaporator under reduced pressure for 12 hours to obtain semitransparent blue substances 3M-1% PrSm—GdY—Yb (substance described in Example 3, Y-based material without impurity) and 3M-1% PrSm—GdY-10% Yb.

The semitransparent blue substances 3M-1% PrSm—GdY—Yb and 3M-1% PrSm—GdY-10% Yb were each dissolved in methanol (j in FIG. 3), and were diluted using a measuring flask to obtain 1.50 mol/l coating solutions 3Cs-1% PrSm—GdY—Yb (Example 3, coating solution for Y-based superconductor) and 3Cs-1% PrSm—GdY-10% Yb, respectively.

The coating solutions 3Cs-1% PrSm—GdY—Yb and 3Cs-1% PrSm—GdY-10% Yb were mixed with each other at a ratio of 7:1, 6:2, 4:4, or 2:6 to obtain coating solutions 3Cs-1% PrSm—GdY-3% Yb, 3Cs-1% PrSm—GdY-4% Yb, 3Cs-1% PrSm—GdY-6% Yb, and 3Cs-1% PrSm—GdY-8% Yb.

A film was formed by using the coating solutions 3Cs-1% PrSm—GdY—Yb, 3Cs-1% PrSm—GdY-3% Yb, 3Cs-1% PrSm—GdY-4% Yb, 3Cs-1% PrSm—GdY-6% Yb, 3Cs-1% PrSm—GdY-8% Yb, and 3Cs-1% PrSm—GdY-11Yb by a spin coating method at a maximum rotation number of 2000 rpm.

Subsequently, calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower. The superconducting films 3FS-1% PrSm—GdY—Yb (Example 3, Y-based film of superconductor), 3FS-1% PrSm—GdY-3% Yb, 3FS-1% PrSm—GdY-4% Yb, 3FS-1% PrSm—GdY-6% Yb, 3FS-1% PrSm—GdY-8% Yb, and 3FS-1% PrSm—GdY-10% Yb were obtained.

The superconducting films 3FS-1% PrSm—GdY—Yb, 3FS-1% PrSm—GdY-3% Yb, 3FS-1% PrSm—GdY-4% Yb, 3FS-1% PrSm—GdY-6% Yb, 3FS-1% PrSm—GdY-8% Yb, and 3FS-1% PrSm—GdY-10% Yb were measured by a $2\theta/\omega$ method in XRD measurement, and it was confirmed that a peak was obtained at approximately the same position as a YBCO (00n) peak. This result indicates that PrBCO, SmBCO, and YbBCO have been formed in a Perovskite structure continuous to YBCO.

The superconducting films 3FS-1% PrSm—GdY—Yb, 3FS-1% PrSm—GdY-3% Yb, 3FS-1% PrSm—GdY-4% Yb, 3FS-1% PrSm—GdY-6% Yb, 3FS-1% PrSm—GdY-8% Yb, and 3FS-1% PrSm—GdY-10% Yb were each disposed in liquid nitrogen, and a superconducting characteristic thereof was measured under a self-magnetic field by an induction method. Jc values were 6.5, 6.5, 6.4, 6.3, 6.4, and 6.1 $MA/cm^2$ (77 K, 0 T), respectively. It is considered that these Jc values are relatively satisfactory. A 5 times degradation phenomenon caused by ultimate dispersion of PrBCO is not easily confirmed because of corresponding to 5% degradation of a Jc value in the above samples. However, if clustering occurs, an effect is confirmed by Jc-B measurement.

A characteristic improvement ratio Eff (X, T, B1, B2) was examined in order to examine presence of characteristic improvement, and Eff (3FS-1% PrSm—GdY-10% Yb, 77 K, 1 T, 5 T)=2.402 was obtained.

Similarly, Eff (3FS-1% PrSm—GdY—Yb, 77 K, 1 T, 5 T)=1.743 was obtained, and Eff was improved from 1.743 to 2.402 by increase of Yb from standard 2% to 10%. It is found that the nucleation frequency is increased, the size of an artificial pin is reduced, and a magnetic field characteristic at 77 K is improved.

Similarly to the above, Eff (3FS-1% PrSm—GdY-3% Yb, 77 K, 1 T, 5 T), Eff (3FS-1% PrSm—GdY-4% Yb, 77 K, 1 T, 5 T), Eff (3FS-1% PrSm—GdY-6% Yb, 77 K, 1 T, 5 T), and Eff (3FS-1% PrSm—GdY-8% Yb, 77 K, 1 T, 5 T) were examined, and were 1.967, 2.135, 2.257, and 2.312, respectively. It has been found that there is a clear effect even when the content of Yb is 1.5 times.

In this Example, GdY and Y are mixed at 1:1 for Y, and Yb is used for Lu. An average ionic radius of MA is closer to that of PA or SA, and an ionic radius of CA is also closer by using Yb in place of Lu in view of clustering conditions. It has been found that increase in CA increases a nucleation frequency and reduces the size of an artificial pin even in this situation.

It has been found that the technique for reducing the size of an artificial pin by excessive CA or SA obtains a similar effect even when MA is a different system from a Y simple substance, or there are different average ionic radii by mixing as described above. In the TFA-MOD method, shape anisotropy such as an ionic radius or a lattice constant has a special meaning in clustering of an artificial pin. Also in the technique for controlling the size of an artificial pin, an average value of an ionic radius of an element to be added has a special meaning.

An average ionic radius of each of PA, SA, MA, and CA is a key factor in the technique for controlling the size of an artificial pin. It is indicated that only when each of the average ionic radii satisfies desired conditions, a nucleation frequency is increased, the CARP size is reduced, and a magnetic field characteristic is improved. It may be expected that an element other than those used in Example 3 has a similar effect as long as the element can be clustered.

Example 4

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 4Mi-2% PrSm—Y—Lu (substance described in Example 4, Y-based material with impurity) was obtained.

Similarly, powdery hydrates of $Pr(OCOCH_3)_3$, $Sm(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 4Mi-2% PrSm—Y—Yb was obtained.

Each of the obtained semitransparent blue substances 4Mi-2% PrSm—Y—Lu and 4Mi-2% PrSm—Y—Yb contained water or acetic acid as a byproduct of a reaction at the time of synthesis of a solution in an amount of about 7 wt %.

The obtained semitransparent blue substances 4Mi-2% PrSm—Y—Lu and 4Mi-2% PrSm—Y—Yb were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 4M-2% PrSm—Y—Lu (substance described in Example 4, Y-based material without impurity) and 4M-2% PrSm—Y—Yb, respectively.

The semitransparent blue substances 4M-2% PrSm—Y—Lu and 4M-2% PrSm—Y—Yb were dissolved in methanol (j in FIG. 3), and were diluted using a measuring flask to obtain 1.50 mol/l coating solutions 4Cs-2% PrSm—Y—Lu (Example 4, coating solution for Y-based superconductor) and 4Cs-2% PrSm—Y—Yb in terms of a metal ion, respectively.

The coating solutions 4Cs-2% PrSm—Y—Lu and 4Cs-2% PrSm—Y—Yb were mixed with each other at a ratio of 1:3, 2:2, or 3:1 to obtain coating solutions 4Cs-2% PrSm—Y-3% Yb1% Lu, 4Cs-2% PrSm—Y-2% Yb2% Lu, and 4Cs-2% PrSm—Y-1% Yb3% Lu.

A film was formed by using the coating solutions 4Cs-2% PrSm—Y—Lu, 4Cs-2% PrSm—Y-3% Yb1% Lu, 4Cs-2% PrSm—Y-2% Yb2% Lu, 4Cs-2% PrSm—Y-11Yb3% Lu, and 4Cs-2% PrSm—Y—Yb by a spin coating method at a maximum rotation number of 2000 rpm.

Subsequently, calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower. The superconducting films 4FS-2% PrSm—Y—Lu (Example 4, Y-based film of superconductor), 4FS-2% PrSm—Y-1Yb3% Lu, 4FS-2% PrSm—Y-2% Yb2% Lu, 4FS-2% PrSm—Y-3% Yb1% Lu, and 4FS-2% PrSm—Y—Yb were obtained.

The superconducting films 4FS-2% PrSm—Y—Lu, 4FS-2% PrSm—Y-11Yb3% Lu, 4FS-2% PrSm—Y-2% Yb2% Lu, 4FS-2% PrSm—Y-3% Yb1% Lu, and 4FS-2 PrSm—Y—Yb were measured by a 2θ/ο method in XRD measurement, and it was confirmed that a peak was obtained at approximately the same position as a YBCO (00n) peak. This result indicates that PrBCO, SmBCO, YbBCO, and LuBCO have been formed in a Perovskite structure continuous to YBCO.

The superconducting films 4FS-2% PrSm—Y—Lu, 4FS-2% PrSm—Y-1% Yb3% Lu, 4FS-2% PrSm—Y-2% Yb2% Lu, 4FS-2% PrSm—Y-3% Yb1% Lu, and 4FS-2% PrSm—Y—Yb were each disposed in liquid nitrogen, and a superconducting characteristic thereof was measured under a self-magnetic field by an induction method. Jc values were 5.9, 6.1, 5.8, 6.0, and 6.3 $MA/cm^2$ (77 K, 0 T), respectively. It is considered that these Jc values are relatively satisfactory. A 5 times degradation phenomenon caused by ultimate dispersion of PrBCO corresponds to 10% degradation of a Jc value in the above samples. However, it is considered that the phenomenon has not been observed.

A characteristic improvement ratio Eff (X, T, B1, B2) was examined in order to examine presence of characteristic improvement, and Eff (4FS-2% PrSm—Y—Yb, 77 K, 1 T, 5 T)=1.852 was obtained.

Similarly, Eff (4FS-2% PrSm—Y—Lu, 77 K, 1 T, 5 T)=1.501 was obtained. A sample obtained by mixing Lu and Yb is as follows. Eff (4FS-2% PrSm—Y-1% Yb3% Lu, 77 K, 1 T, 5 T)=1.589, Eff (4FS-2% PrSm—Y-2% Yb2% Lu, 77 K, 1 T, 5 T=1.650, and Eff (4FS-2% PrSm—Y-3% Yb1% Lu, 77 K, 1 T, 5 T)=1.737 were obtained. The result indicates that a magnetic field characteristic improvement ratio is increased by increase in the content of Yb.

In CARP formation in YBCO, YbBCO has a higher nucleation frequency than LuBCO, and it is estimated that the frequency is about seven times. The ionic radius of Lu or Yb is quite different from that of Y for MA. It is known that the difference in the ionic radius is reduced by about 25% when Yb is used in place of Lu. When Y is used for MA, it is considered that the nucleation frequency due to Lu or Yb is determined by the difference in the ionic radius. The larger the difference in the ionic radius is, the lower the nucleation frequency is.

It is considered that this argument is close to argument of lattice mismatch. It is said that growing does not occur when the lattice mismatch is about 7%. This state is a state in which the nucleation frequency is reduced to zero. When the lattice mismatch is zero, the nucleation frequency is maximum. However, the mismatch changes linearly, but the nucleation frequency changes in an exponential and logarithmic manner. That is, a calculation scientist points out that reduction of mismatch by 25% improves the nucleation frequency by about 10 times. It is considered that change of CA from Lu to Yb has caused this increase in the nucleation frequency.

In the future, conditions of a smaller ionic radius or a combination thereof should be developed. However, naturally, a best temperature region for improving a magnetic field characteristic should be present according to a difference in an ionic radius. It is known that an effect of improvement of a magnetic field characteristic is observed when Er, Tm, Yb, or Lu enters CA. However, it is considered that a temperature region for improving a magnetic field characteristic is present in a discontinuous region when 100% of these elements enter CA. Therefore, a technique for generating an effect in an intermediate region thereof is desired.

In the control of the pin size in Examples 1 to 3, it is only possible to increase the nucleation frequency by increasing an element in a CA site. However, in the present Example, it has been found that by mixing Yb and Lu, CA realizing an intermediate nucleation frequency thereof can be obtained. This allows CARP having a maximum magnetic field characteristic to be formed in any temperature region.

Example 5

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 5Mi-2% PrSm—Y—Yb (substance described in Example 5, Y-based material with impurity) was obtained.

Similarly, powdery hydrates of $Pr(OCOCH_3)_3$, $Eu(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 5Mi-2% PrEu—Y—Yb was obtained.

Each of the obtained semitransparent blue substances 5Mi-2% PrSm—Y—Yb and 5Mi-2% PrEu—Y—Yb contained water or acetic acid as a byproduct of a reaction at the time of synthesis of a solution in an amount of about 7 wt %.

The obtained semitransparent blue substances 5Mi-2% PrSm—Y—Yb and 5Mi-2% PrEu—Y—Yb were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 5M-2% PrSm—Y—Yb (substance described in Example 5, Y-based material without impurity) and 5M-2% PrEu—Y—Yb, respectively.

The semitransparent blue substances 5M-2% PrSm—Y—Yb and 5M-2% PrEu—Y—Yb were dissolved in methanol (j in FIG. 3), and were diluted using a measuring flask to obtain 1.50 mol/l coating solutions 5Cs-2% PrSm—Y—Yb (Example 5, coating solution for Y-based superconductor) and 5Cs-2% PrEu—Y—Yb in terms of a metal ion, respectively.

The coating solutions 5Cs-2% PrSm—Y—Yb and 5Cs-2% PrEu—Y—Yb were mixed with each other at a ratio of 3:1, 2:2, or 1:3 to obtain coating solutions 5Cs-2% Pr1% Sm3% Eu—Y—Yb, 5Cs-2% Pr2% Sm2% Eu—Y—Yb, and 5Cs-2% Pr3% Sm1% Eu—Y—Yb.

A film was formed by using the coating solutions 5Cs-2% PrSm—Y—Yb, 5Cs-2% Pr1% Sm3% Eu—Y—Yb, 5Cs-2% Pr2% Sm2% Eu—Y—Yb, 5Cs-2% Pr3% Sm1% Eu—Y—Yb, and 5Cs-2% PrEu—Y—Yb by a spin coating method at a maximum rotation number of 2000 rpm.

Calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower. The superconducting films 5FS-2% PrSm—Y—Yb (Example 5, Y-based film of superconductor), 5FS-2% Pr3% Sm1% Eu—Y—Yb, 5FS-2% Pr2% Sm2% Eu—Y—Yb, 5FS-2% Pr1% Sm3% Eu—Y—Yb, and 5FS-2% PrEu—Y—Yb were obtained.

The superconducting films 5FS-2% PrSm—Y—Yb, 5FS-2% Pr3% Sm1% Eu—Y—Yb, 5FS-2% Pr2% Sm2% Eu—Y—Yb, 5FS-2% Pr1% Sm3% Eu—Y—Yb, and 5FS-2% PrEu—Y—Yb were measured by a 2θ/w method in XRD measurement, and it was confirmed that a peak was obtained at approximately the same position as a YBCO (00n) peak. This result indicates that PrBCO, SmBCO, EuBCO, YBCO, and YbBCO have been formed in a Perovskite structure continuous to YBCO.

The superconducting films 5FS-2% PrSm—Y—Yb, 5FS-2% Pr3% Sm1% Eu—Y—Yb, 5FS-2% Pr2% Sm2% Eu—Y—Yb, 5FS-2% Pr1% Sm3% Eu—Y—Yb, and 5FS-2% PrEu—Y—Yb were each disposed in liquid nitrogen, and a superconducting characteristic thereof was measured under a self-magnetic field by an induction method. Jc values were 7.2, 7.0, 6.9, 6.7, and 6.4 $MA/cm^2$ (77 K, 0 T), respectively. It is considered that these Jc values are relatively satisfactory. A 5 times degradation phenomenon caused by ultimate dispersion of PrBCO corresponds to 10% degradation of a Jc value in the above samples. However, it is considered that the phenomenon has not been observed.

A characteristic improvement ratio Eff (X, T, B1, B2) was examined, and Eff (5FS-2% PrSm—Y—Yb, 77 K, 1 T, 5 T)=1.852 was obtained.

Similarly, Eff (5FS-2% PrEu—Y—Yb, 77 K, 1 T, 5 T)=2.232 was obtained. A sample obtained by mixing Yb and Yb is as follows. Eff (5FS-2% Pr3% Sm1% Eu—Y—Yb, 77 K, 1 T, 5 T)=1.956, Eff (5FS-2% Pr2% Sm2% Eu—Y—Yb, 77 K, 1 T, 5 T=2.044, and Eff (5FS-2% Pr1% Sm3% Eu—Y—Yb, 77 K, 1 T, 5 T)=2.150 were obtained. The result indicates that a magnetic field characteristic improvement ratio is increased by increase in the content of Eu.

In CARP formation in YBCO, EuBCO has a higher nucleation frequency than SmBCO, and it is estimated that the frequency is about ten times. The ionic radius of Sm or Eu is different from that of Y for MA. However, it is known that the difference in the ionic radius is reduced by about 30% by using Eu in place of Sm. When Y is used for MA, it is considered that the nucleation frequency due to Sm or Eu is determined by the difference in the ionic radius. The larger the difference in the ionic radius is, the lower the nucleation frequency is.

This argument is almost the same as that in Example 4. This indicates that use of two kinds of elements on an SA side realizes an intermediate nucleation frequency, and allows the nucleation frequency to be controlled. In other words, the size of an artificial pin can be controlled in order to realize a maximum magnetic field characteristic in a desired temperature region.

Examples 4 and 5 indicate a result obtained by slightly adjusting the size of CA or SA by mixing two kinds of elements. However, it is considered that a similar effect can be obtained by three or more kinds of elements.

Example 6

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Dy(OCOCH_3)_3$, $Tm(OCOCH_3)_3$, $Ba(OCOCH)_2$, and $Cu(OCOCH_3)_2$ as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 6Mi-1% PrSmDyTm (substance described in Example 6, Dy-based material with impurity) was obtained.

Similarly, powdery hydrates of $Pr(OCOCH_3)_3$, $Sm(OCOCH_3)_3$, $Dy(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.01:0.01:0.88:0.10:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 6Mi-1% PrSm—Dy-10% Tm was obtained.

In addition, a similar solution was prepared using Ho in place of the above Dy to obtain semitransparent blue substances 6Mi-1% PrSmHoTm and 6Mi-1% PrSm—Ho-10% Tm.

Each of the obtained semitransparent blue substances 6Mi-1% PrSm—Dy—Tm, 6Mi-1% PrSmDy10% Tm, 6Mi-1% PrSm—Ho—Tm, and 6Mi-1% PrSm—Ho-10% Tm contained water or acetic acid as a byproduct of a reaction at the time of synthesis of a solution in an amount of about 7 wt %.

The obtained semitransparent blue substances 6Mi-1% PrSm—Dy—Tm, 6Mi-1% PrSm—Dy-10% Tm, 6Mi-1% PrSm—Ho—Tm, and 6Mi-1% PrSm—Ho-10% Tm were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 6M-1% PrSm—Dy—Tm (substance described in Example 6, Dy-based material without impurity), 6M-1% PrSmDy10% Tm, 6M-1% PrSm—Ho—Tm, and 6M-1% PrSm—Ho-10% Tm, respectively.

The semitransparent blue substances 6M-11 % PrSm—Dy—Tm, 6M-11 % PrSm—Dy-10% Tm, 6M-1% PrSm—Ho—Tm, and 6M-11 % PrSm—Ho-10% Tm were each dissolved in methanol (j in FIG. 3), and were diluted using a measuring flask to obtain 1.50 mol/l coating solutions 6Cs-1% PrSm—Dy—Tm (Example 6, coating solution for Dy-based superconductor), 6Cs-1% PrSm—Dy-10% Tm, 6Cs-1% PrSm—Ho—Tm, and 6Cs-1% PrSm—Ho-10% Tm, respectively.

The coating solutions 6Cs-1% PrSm—Dy—Tm and 6Cs-1% PrSm—Dy-10% Tm were mixed with each other at a ratio of 7:1, 6:2, 4:4, or 2:6 to obtain coating solutions 6Cs-1% PrSm—Dy-3% Tm, 6Cs-1% PrSm—Dy-4% Tm, 6Cs-1% PrSmDy6% Tm, and 6Cs-1% PrSmDy8% Tm.

Similarly, the coating solutions 6Cs-1% PrSm—Ho—Tm and 6Cs-1% PrSm—Ho-10% Tm were mixed with each other at a ratio of 7:1, 6:2, 4:4, or 2:6 to obtain coating solutions 6Cs-1% PrSm—Ho-3% Tm, 6Cs-1% PrSm—Ho-4% Tm, 6Cs-1% PrSm—Ho-6% Tm, and 6Cs-1% PrSm—Ho-8% Tm.

A film was formed by using the coating solutions 6Cs-1% PrSm—Dy—Tm, 6Cs-1% PrSm—Dy-3% Tm, 6Cs-1% PrSm—Dy-4% Tm, 6Cs-1% PrSm—Dy-6% Tm, 6Cs-1% PrSm—Dy-8% Tm, 6Cs-1% PrSm—Dy-10% Tm, 6Cs-1% PrSm—Ho—Tm, 6Cs-1% PrSm—Ho-3% Tm, 6Cs-1% PrSm—Ho-4% Tm, 6Cs-1% PrSm—Ho-6% Tm, 6Cs-1% PrSm—Ho-8% Tm, and 6Cs-1% PrSm—Ho-10% Tm by a spin coating method at a maximum rotation number of 2000 rpm.

Calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower. The superconducting films 6FS-1% PrSmDyTm (Example 6, Dy-based film of superconductor), 6FS-1% PrSm—Dy-3% Tm, 6FS-1% PrSm—Dy-4% Tm, 6FS-1% PrSm—Dy-6% Tm, 6FS-1% PrSm—Dy-8% Tm, 6FS-1% PrSm—Dy-10% Tm, 6FS-1% PrSm—Ho—Tm, 6FS-1% PrSm—Ho-3% Tm, 6FS-1% PrSm—Ho-4% Tm, 6FS-1% PrSm—Ho-6% Tm, 6FS-1% PrSm—Ho-8% Tm, and 6FS-1% PrSm—Ho-10% Tm were obtained.

The superconducting films 6FS-1% PrSm—Dy—Tm, 6FS-1% PrSm—Dy-3% Tm, 6FS-1% PrSm—Dy-4% Tm, 6FS-1% PrSm—Dy-6% Tm, 6FS-1% PrSm—Dy-8% Tm, and 6FS-1% PrSm—Dy-10% Tm were measured by a $2\theta/\omega$ method in XRD measurement, and it was confirmed that a peak was obtained at approximately the same position as a DyBCO (00n) peak.

Similarly, the superconducting films 6FS-1% PrSm—Ho—Tm, 6FS-1% PrSm—Ho-3% Tm, 6FS-1% PrSm—Ho-4% Tm, 6FS-1% PrSm—Ho-6% Tm, 6FS-1% PrSm—Ho-8% Tm, and 6FS-1% PrSm—Ho-10% Tm were measured by a $2\theta/\omega$ method in XRD measurement, and it was confirmed that a peak was obtained at approximately the same position as a HoBCO (00n) peak.

The superconducting films 6FS-1% PrSm—Dy—Tm, 6FS-1% PrSm—Dy-3% Tm, 6FS-1% PrSm—Dy-4% Tm, 6FS-1% PrSm—Dy-6% Tm, 6FS-1% PrSm—Dy-8% Tm, 6FS-1% PrSm—Dy-10% Tm, 6FS-1% PrSm—Ho—Tm, 6FS-1% PrSm—Ho-3% Tm, 6FS-1% PrSm—Ho-4% Tm, 6FS-1% PrSm—Ho-6% Tm, 6FS-1% PrSm—Ho-8% Tm, and 6FS-1% PrSm—Ho-10% Tm were each disposed in liquid nitrogen, and a superconducting characteristic thereof was measured under a self-magnetic field by an induction method. Jc values were 6.2, 6.1, 6.5, 6.4, 6.3, 6.0, 6.2, 6.0, 6.3, 6.3, 6.4, and 6.2 $MA/cm^2$ (77 K, 0 T), respectively. It is considered that these Jc values are relatively satisfactory. A 5 times degradation phenomenon caused by ultimate dispersion of PrBCO is not easily confirmed because of corresponding to 5% degradation of a Jc value in the above samples. However, if clustering occurs, an effect is confirmed by Jc-B measurement.

A characteristic improvement ratio Eff (X, T, B1, B2) was examined in order to examine presence of characteristic improvement, and Eff (6FS-1% PrSm—Dy—Tm, 77 K, 1 T, 5 T), Eff (6FS-1% PrSm—Dy-3% Tm, 77 K, 1 T, 5 T), Eff (6FS-1% PrSm—Dy-4% Tm, 77 K, 1 T, 5 T), Eff (6FS-1% PrSm—Dy-6% Tm, 77 K, 1 T, 5 T), Eff (6FS-1% PrSm—Dy-8% Tm, 77 K, 1 T, 5 T), and Eff (6FS-1% PrSm—Dy-10% Tm, 77 K, 1 T, 5 T) were 2.112, 2.403, 2.512, 2.630, 2.670, and 2.703, respectively.

Similarly, in order to examine presence of characteristic improvement, Eff (6FS-1% PrSm—Ho—Tm, 77 K, 1 T, 5 T), Eff (6FS-1% PrSm—Ho-3% Tm, 77 K, 1 T, 5 T), Eff (6FS-1% PrSm—Ho-4% Tm, 77 K, 1 T, 5 T), Eff (6FS-1% PrSm—Ho-6% Tm, 77 K, 1 T, 5 T), Eff (6FS-1% PrSm—Ho-8% Tm, 77 K, 1 T, 5 T), and Eff (6FS-1% PrSm—Ho-10% Tm, 77 K, 1 T, 5 T) were examined, and were consequently 2.060, 2.388, 2.482, 2.570, 2.630, and 2.654, respectively.

The above result is close to a case where Y is used for MA. CARP has a high tendency to be formed with shape anisotropy, and it is considered that the tendency is reflected on the above result. That is, another element having a similar ionic radius can be used for MA. It is found that even when Dy or Ho which is considered to have a similar ionic radius to Y is used in place of Y, clustering can be caused similarly, CARP is formed, and an effect for improving a magnetic field characteristic is obtained.

In addition, it has been found that 3% Tm or 3% Tm is also effective with respect to a sample of 2% Tm or 2% Tm as a reference. It is considered that the size of CARP is reduced only by a fact that the nucleation frequency has become 1.5 times and Jc-B measurement indicates an effect.

CARP is formed also in a system using Gd+Y for MA in place of Y, and a magnetic field characteristic has been improved. There is a very large possibility that formation of CARP by the TFA-MOD method is determined by shape anisotropy, and it is considered that a similar effect is exhibited by mixing Dy or Ho with Y, or the like for use.

Example 7

First, two kinds of coating solutions for a superconductor were synthesized and purified according to the flowchart illustrated in FIG. 3. Powdery hydrates of $Pr(OCOCH_3)_3$, $Gd(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.02:0.48:0.48:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 7Mi-2% Pr—GdY-2% Tm (substance described in Example 7, GdY-based material with impurity) was obtained.

Similarly, powdery hydrates of $Pr(OCOCH_3)_3$, $Y(OCOCH_3)_3$, $Gd(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.02:0.44:0.44:0.10:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 7Mi-2% Pr—GdY-10% Tm was obtained.

Each of the obtained semitransparent blue substances 7Mi-2% Pr—GdY-2% Tm and 7Mi-2% PrSm—GdY-10% Tm contained water or acetic acid as a byproduct of a reaction at the time of synthesis of a solution in an amount of about 7 wt %.

The obtained semitransparent blue substances 7Mi-2% Pr—GdY-2% Tm and 7Mi-2% Pr—GdY-10% Tm were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 7M-2% Pr—GdY-2% Tm (substance described in Example 7, Y-based material without impurity) and 7M-2% Pr—GdY-10% Tm, respectively.

The semitransparent blue substances 7M-2% Pr—GdY-2% Tm and 7M-2% Pr—GdY-10% Tm were each dissolved in methanol (j in FIG. 3), and were diluted using a measuring flask to obtain 1.50 mol/l coating solutions 7Cs-2% Pr—GdY-2% Tm (Example 7, coating solution for Y-based superconductor) and 7Cs-2% Pr—GdY-10% Tm, respectively.

The coating solutions 7Cs-2% Pr—GdY-2% Tm and 7Cs-2% Pr—GdY-10% Tm were mixed with each other at a ratio of 7:1, 6:2, 4:4, or 2:6 to obtain coating solutions 7Cs-2% Pr—GdY-3% Tm, 7Cs-2% Pr—GdY-4% Tm, 7Cs-2% Pr—GdY-6% Tm, and 7Cs-2% Pr—GdY-8% Tm.

A film was formed by using the coating solutions 7Cs-2% Pr—GdY-2% Tm, 7Cs-2% Pr—GdY-3% Tm, 7Cs-2% Pr—GdY-4% Tm, 7Cs-2% Pr—GdY-6% Tm, 7Cs-2% Pr—GdY-8% Tm, and 7Cs-2% Pr—GdY-10% Tm by a spin coating method at a maximum rotation number of 2000 rpm.

Calcining was performed in an atmosphere of pure oxygen at 400° C. or lower according to the profile illustrated in FIG. 5. Subsequently, firing was performed in a 1000 ppm oxygen-mixed argon gas at 800° C. according to the profile illustrated in FIG. 6. Subsequently, annealing was performed in pure oxygen at 525° C. or lower, and the superconducting films 7FS-2% Pr—GdY-2% Tm (Example 7, Y-based film of superconductor), 7FS-2% Pr—GdY-3% Tm, 7FS-2% Pr—GdY-4% Tm, 7FS-2% Pr—GdY-6% Tm, 7FS-2% Pr—GdY-8% Tm, and 7FS-2% Pr—GdY-10% Tm were obtained.

The superconducting films 7FS-2% Pr—GdY-2% Tm, 7FS-2% Pr—GdY-3% Tm, 7FS-2% Pr—GdY-4% Tm, 7FS-2% Pr—GdY-6% Tm, 7FS-2% Pr—GdY-8% Tm, and 7FS-2% Pr—GdY-10% Tm were measured by a 2θ/ω method in XRD measurement, and it was confirmed that a peak was obtained at approximately the same position as a YBCO (00n) peak. This result indicates that PrBCO and TmBCO have been formed in a Perovskite structure continuous to GdBCO+YBCO.

The superconducting films 7FS-2% Pr—GdY-2% Tm, 7FS-2% Pr—GdY-3% Tm, 7FS-2% Pr—GdY-4% Tm, 7FS-2% Pr—GdY-6% Tm, 7FS-2% Pr—GdY-8% Tm, and 7FS-2% Pr—GdY-10% Tm were each disposed in liquid nitrogen, and a superconducting characteristic thereof was measured under a self-magnetic field by an induction method. Jc values were 6.5, 6.5, 6.4, 6.3, 6.4, and 6.1 $MA/cm^2$ (77 K, 0 T), respectively. It is considered that these Jc values are relatively satisfactory. A 5 times degradation phenomenon caused by ultimate dispersion of PrBCO is not easily confirmed because of corresponding to 5% degradation of a Jc value in the above samples. However, if clustering occurs, an effect is confirmed by Jc-B measurement.

A characteristic improvement ratio Eff (X, T, B1, B2) was examined in order to examine presence of characteristic improvement, and Eff (7FS-2% Pr—GdY-2% Tm, 77 K, 1 T, 5 T), Eff (7FS-2% Pr—GdY-3% Tm, 77 K, 1 T, 5 T), Eff (7FS-2% Pr—GdY-4% Tm, 77 K, 1 T, 5 T), Eff (7FS-2% Pr—GdY-6% Tm, 77 K, 1 T, 5 T), Eff (7FS-2% Pr—GdY-8% Tm, 77 K, 1 T, 5 T), and Eff (7FS-2% Pr—GdY-10% Tm, 77 K, 1 T, 5 T) were 1.203, 1.350, 1.404, 1.450, 1.482, and 1.521, respectively.

The above system is the third CARP to form an artificial pin without SA. A high pin force is expected theoretically. In Example 7, an effect of improvement of a magnetic field characteristic is observed although being small. It has been found that the size of CARP is reduced by increase in CA to obtain an effect of improvement of a magnetic field characteristic also in the third CARP.

In the present Example, Tm having a relatively large ionic radius was used considering formation of CARP due to shape anisotropy. It is considered that the size of CARP is reduced by change from 2% Tm to 3% Tm, and it has been found that this is effective for improving a magnetic field characteristic. In the third CARP containing no SA, a small artificial pin is realized by increase in the content of CA, and by mixing two or more kinds of CAs, an artificial pin having an intermediate size therebetween should be realized. Example 7 has supported this.

Example 8

First, two kinds of coating solutions for a superconductor were synthesized and purified according to the flowchart illustrated in FIG. 3. Powdery hydrates of $Pr(OCOCH_3)_3$, $Sm(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 8Mi-2% PrSm—Y—Yb (substance described in Example 8, Y-based material with impurity) was obtained.

Similarly, powdery hydrates of $Pr(OCOCH_3)_3$, $Sm(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.02:0.02:0.80:0.16:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 8Mi-2% PrSm—Y-16% Yb was obtained.

Similarly, powdery hydrates of $Pr(OCOCH_3)_3$, $Sm(OCOCH_3)_3$, $Y(OCOCH_3)_3$, $Yb(OCOCH_3)_3$, $Ba(OCOCH_3)_2$, and $Cu(OCOCH_3)_2$ as metal acetates were dissolved in ion exchange water at a metal ion molar ratio of 0.01:0.01:0.90:0.08:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 8Mi-1% PrSm—Y-8% Yb was obtained.

Each of the obtained semitransparent blue substances 8Mi-2% PrSm—Y—Yb, 8Mi-2% PrSm—Y-16% Yb, and 8Mi-11% PrSm—Y-8% Yb contained water or acetic acid as a byproduct of a reaction at the time of synthesis of a solution in an amount of about 7 wt %.

The obtained semitransparent blue substances 8Mi-2% PrSm—Y—Yb, 8Mi-2% PrSm—Y-16% Yb, and 8Mi-11% PrSm—Y-8% Yb were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 8M-2% PrSm—Y—Yb (substance described in Example 8, Y-based material without impurity), 8M-2% PrSm—Y-16% Yb, and 8M-1% PrSm—Y-8% Yb, respectively.

The semitransparent blue substances 8M-2% PrSm—Y—Yb, 8M-2% PrSm—Y-16% Yb, and 8M-1% PrSm—Y-8% Yb were each dissolved in methanol (j in FIG. 3), and were diluted using a measuring flask to obtain 1.50 mol/l coating solutions 8Cs-2% PrSm—Y—Yb(Example 8, coating solution for Y-based superconductor), 8Cs-2% PrSm—Y-16% Yb, and 8Cs-1% PrSm—Y-8% Yb, respectively.

The coating solutions 8Cs-2% PrSm—Y—Yb and 8Cs-2% PrSm—Y-16% Yb were mixed with each other at a ratio of 2:1 or 1:2 to obtain coating solutions 8Cs-2% PrSm—Y-8% Yb and 8Cs-2% PrSm—Y-12% Yb.

A film was formed by using the coating solutions 8Cs-2% PrSmYYb, 8Cs-2% PrSm—Y-8% Yb, 8Cs-2% PrSm—Y-12% Yb, 8Cs-2% PrSm—Y-16% Yb, and 8Cs-1% PrSm—Y-8% Yb by a spin coating method at a maximum rotation number of 2000 rpm. Calcining was performed in an atmosphere of pure oxygen at 400° C. or lower according to the profile illustrated in FIG. 5. Firing was performed in a 1000 ppm oxygen-mixed argon gas at 800° C. according to the profile illustrated in FIG. 6. Annealing was performed in pure oxygen at 525° C. or lower. Superconducting films 8FS-2% PrSm—Y—Yb (Example 8, Y-based film of superconductor), 8FS-2% PrSm—Y-8% Yb, 8FS-2% PrSm—Y-12% Yb, 8FS-2% PrSm—Y-16% Yb, and 8FS-1% PrSm—Y-8% Yb were obtained.

The superconducting films 8FS-2% PrSm—Y—Yb, 8FS-2% PrSm—Y-8% Yb, 8FS-2% PrSm—Y-12% Yb, 8FS-2% PrSm—Y-16% Yb, and 8FS-1% PrSm—Y-8% Yb were measured by a $2\theta/\omega$ method in XRD measurement, and it was confirmed that a peak was obtained at approximately the same position as a YBCO (00n) peak.

An intensity is sufficiently strong, and it is estimated that all the materials form a Perovskite structure. That is, this indicates that PrBCO, SmBCO, and YbBCO are incorporated into a Perovskite structure of YBCO in this system.

Figure 12:
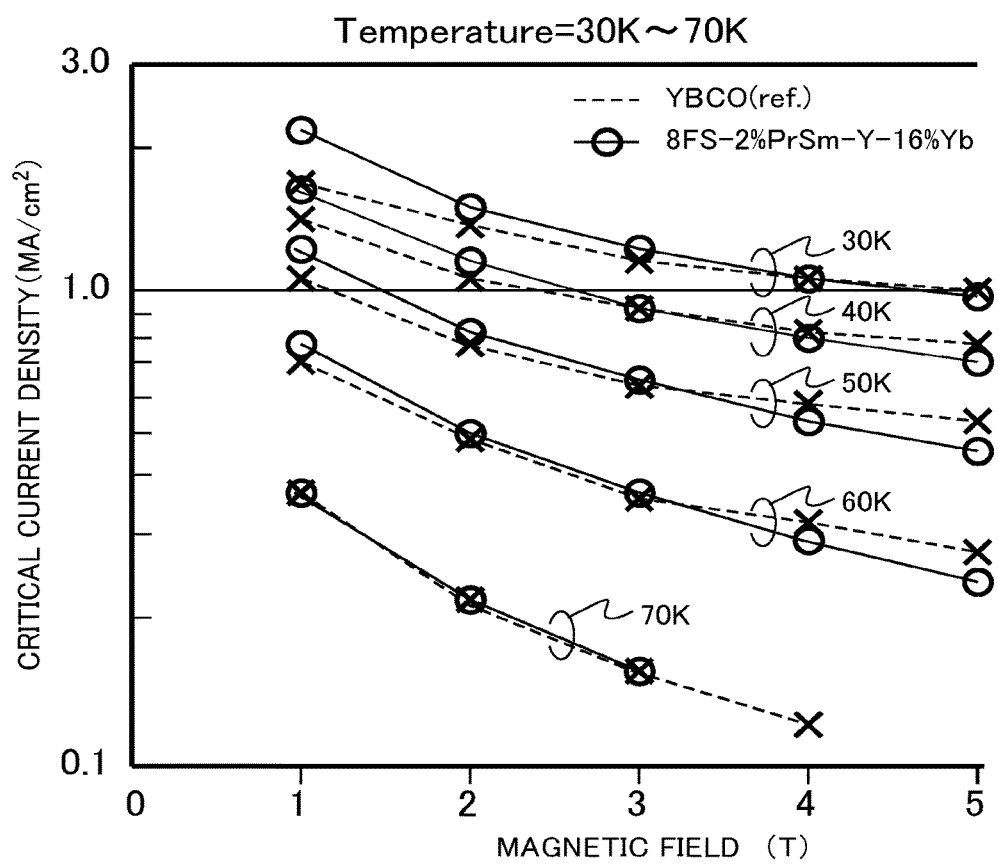
FIG. 12 is a diagram illustrating a result of Jc-B measurement in Example 8.

FIG. 12 is a diagram illustrating a result of Jc-B measurement in Example 8. FIG. 12 illustrates a result obtained by measuring a Jc value of the superconducting film 8FS-2% PrSm—Y-16% Yb in a temperature range of 30 to 77 K in a magnetic field of 1 to 5 T. FIG. 12 also illustrates a measurement result of YBCO containing no CARP. The result of YBCO is indicated by a broken line.

As indicated by FIG. 12, a result at 50 K/5 T or 60 K/5 T is a smaller value than the Jc value of YBCO. This result means that an artificial pin was not very effective in this region. It is considered that such a result was obtained only because a 20% volume corresponding to a CARP portion was present as an obstacle to reduce the Jc value.

Meanwhile, FIG. 12 indicates that a characteristic was largely increased at 1 T. In spite of presence of 20% CARP, a Jc value of a higher characteristic than YBCO was obtained. It is considered that this means that CARP functioned as an artificial pin. It is considered that the result that a lower temperature and lower magnetic field had a higher effect is in contradiction with a result of a conventional oxide superconductor. However, considering the result based on a principle, it cannot be necessarily said that this is true.

The size of CARP of the superconducting film 8FS-2% PrSm—Y-16% Yb is not appropriate at present, and is slightly large. It is considered that the CARP traps a quantum magnetic flux. In this case, in a low magnetic field in which the number of quantum magnetic fluxes in CARP tends to become small, a quantum magnetic flux is easily trapped. It is considered that this is the reason why a lower magnetic field seems to have a larger effect as indicated by data at 30 K in FIG. 12.

Meanwhile, as for the temperature, it is estimated that as a sample temperature is higher, a term of thermal disturbance is more effective, and a quantum magnetic flux easily climbs over CARP which is an ideal artificial pin. It is considered that this is the reason why an effect of CARP is larger as the temperature is changed in a way of 50 K→40 K→30 K in comparison of data at 1 T.

The result obtained this time is not entirely matched with a conventionally-reported result of a BZO artificial pin. However, CARP forming an atom-replaced artificial pin is the world's first artificial pin to exhibit a large pin force in a boundary surface with superconduction. In addition, when a model is considered, the CARP performs an action matched with the model as described above. By considering that the BZO artificial pin is an artificial pin having an unclear boundary, it is considered that the result obtained this time and understanding thereof are closer to an ideal artificial pin.

In order to examine whether an effect for improving a characteristic at 30 K/1 to 3 T was actually caused by CARP, measurement of the superconducting film 8FS-1% PrSm—Y-8% Yb was performed.

Figure 13:
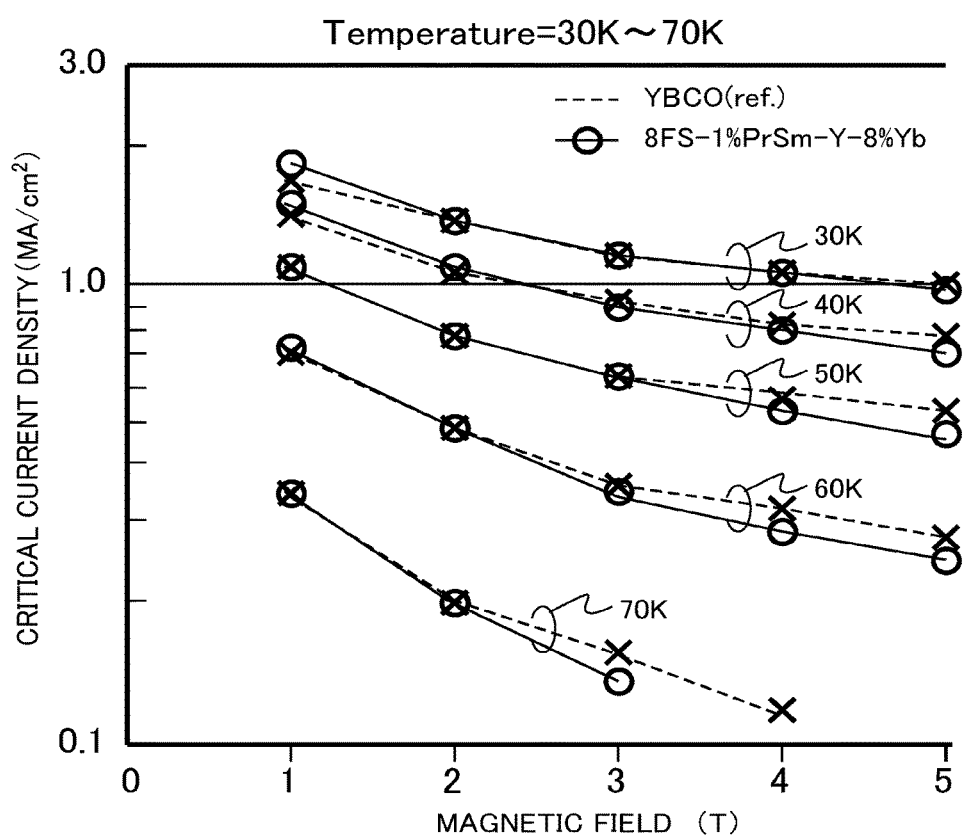
FIG. 13 is a diagram illustrating a result of Jc-B measurement in Example 8.

FIG. 13 is a diagram illustrating a result of Jc-B measurement in Example 8. It is considered that CARP included in the superconducting film 8FS-1% PrSm—Y-8% Yb has the same size as the superconducting film 8FS-2% PrSm—Y-16% Yb and the number of CARP included in the superconducting film 8FS-1% PrSm—Y-8% Yb is half the number of CARP included in the superconducting film 8FS-2% PrSm—Y-16% Yb. That is, this result indicates that an effect of reducing a characteristic of YBCO is only the half in a region having a small effect of CARP, and the effect is only the half in a region in which CARP exhibits an effect.

When FIG. 13 is compared with FIG. 12, it seems that the amount of reduction of a Jc characteristic at 50 K/5 T or 60 K/5 T, having a small effect of CARP became about the half. Of course, this result includes a measurement error and a film thickness fluctuation. Therefore, the reduction amount does not become the half strictly. At 30 to 50 K/1 T or 30 K/2 to 3 T in which it is considered that CARP exhibited an effect, it seems that an effect for improving a Jc characteristic became the half.

From FIGS. 12 and 13, it is considered that CARP exhibited an effect for improving a magnetic field characteristic at a low temperature in a low magnetic field. That is, it is considered that CARP exhibited an effect for improving a magnetic field characteristic at 30 to 50 K/1 T or 30 K/2 to 3 T. Of course, CARP should have exhibited a small effect in other regions, but there is a possibility that the effect was not observed due to being buried in experimental errors.

CARP including Yb did not exhibit a significant effect at a stoichiometric ratio of PA:SA:CA=1:1:2, that is, under a condition in which the number of large and small unit cells was the same. However, it was found that an effect was exhibited by increasing CA from the composition ratio.

Example 9

First, a coating solution for a superconductor was synthesized and purified according to the flowchart illustrated in FIG. 3. Powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 9Mi-2% PrSm—Y—Tm (substance described in Example 9, Y-based material with impurity) was obtained.

Similarly, powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.01:0.01:0.96:0.02:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 9Mi-1% PrSm—Y—Tm was obtained.

Each of the obtained semitransparent blue substances 9Mi-2% PrSm—Y—Tm and 9Mi-1% PrSm—Y—Tm contained water or acetic acid as a byproduct of a reaction at the time of synthesis of a solution in an amount of about 7 wt %.

The obtained semitransparent blue substances 9Mi-2% PrSm—Y—Tm and 9Mi-1% PrSm—Y—Tm were each completely dissolved in methanol having a weight about 100 times each of the substances (f in FIG. 3), and the solutions were subjected to a reaction and purification again in a rotary evaporator under reduced pressure for 12 hours to obtain semitransparent blue substances 9M-2% PrSm—Y—Tm (substance described in Example 9, Y-based material without impurity) and 9M-1% PrSm—Y—Tm, respectively.

The semitransparent blue substances 9M-2% PrSm—Y—Tm and 9M-1% PrSm—Y—Tm were each dissolved in methanol (j in FIG. 3), and were diluted using a measuring flask to obtain 1.50 mol/l coating solutions 9Cs-2% PrSm—Y—Tm (Example 9, coating solution for Y-based superconductor) and 9Cs-1% PrSm—Y—Tm, respectively.

A film was formed by using the coating solutions 9Cs-2% PrSm—Y—Tm and 9Cs-1% PrSm—Y—Tm by a spin coating method at a maximum rotation number of 2000 rpm. Calcining was performed in an atmosphere of pure oxygen at 400° C. or lower according to the profile illustrated in FIG. 5. Firing was performed in a 1000 ppm oxygen-mixed argon gas at 800° C. according to the profile illustrated in FIG. 6. Annealing was performed in pure oxygen at 525° C. or lower. Superconducting films 9FS-2% PrSm—Y—Tm (Example 9, Y-based film of superconductor) and 9FS-1% PrSm—Y—Tm were obtained.

The superconducting films 9FS-2% PrSm—Y—Tm and 9FS-1% PrSm—Y—Tm were measured by a 2θ/e method in XRD measurement, and it was confirmed that a peak was obtained at approximately the same position as a YBCO (00n) peak.

An intensity is sufficiently strong, and it is estimated that all the materials form a Perovskite structure. That is, this indicates that PrBCO, SmBCO, and TmBCO are incorporated into a Perovskite structure of YBCO in this system.

Figure 14:
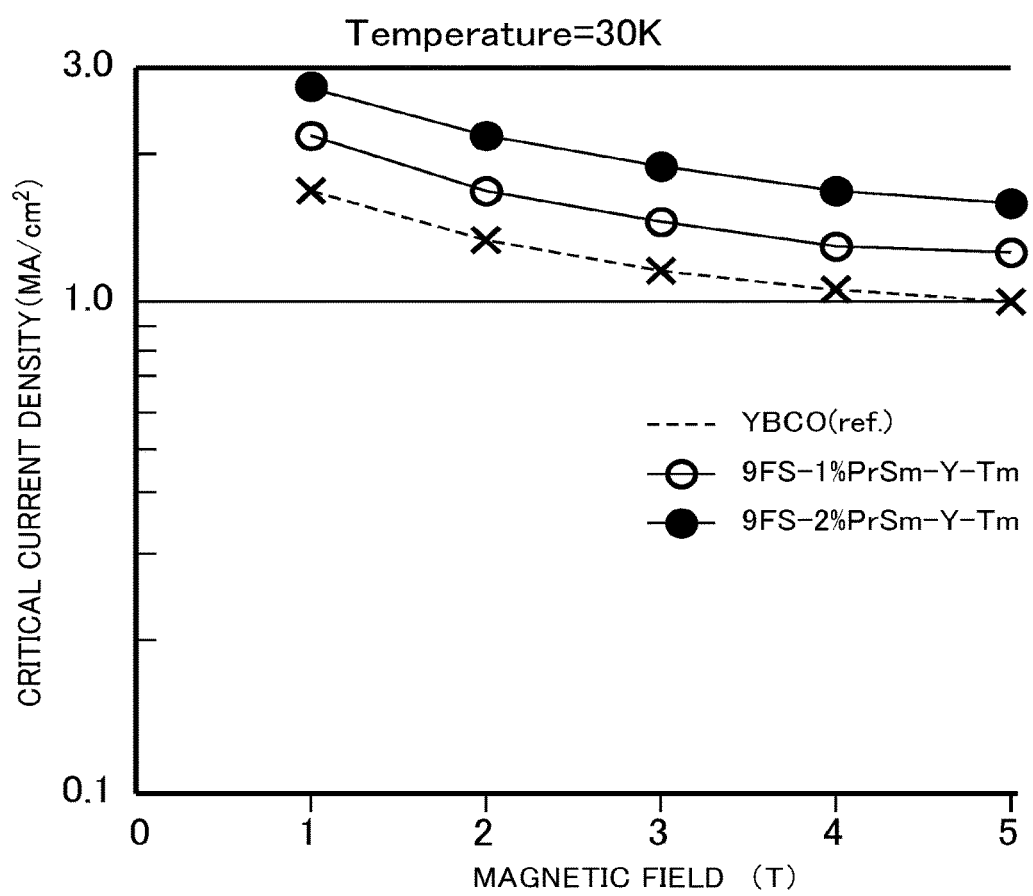
FIG. 14 is a diagram illustrating a result of Jc-B measurement in Example 9.

FIG. 14 is a diagram illustrating a result of Jc-B measurement in Example 9. FIG. 14 illustrates a result obtained by performing Jc measurement of the superconducting films 9FS-2% PrSm—Y—Tm and 9FS-1% PrSm—Y—Tm at 30 K at 1 to 5 T. The upper data in FIG. 14 indicates the present sample. FIG. 14 also illustrates a measurement result of YBCO containing no CARP, indicated by a broken line.

The content of CARP in the superconducting film 9FS-2% PrSm—Y—Tm is 8%. It is estimated that a characteristic is lowered by this content around 30 K/5 T. However, as indicated by the result in FIG. 14, a Jc value much higher than that of YBCO was obtained. Detailed data of lattice mismatch of Yb and Tm with respect to Y during firing at 800° C. is unclear, but it is considered that the mismatch amounts are about 3% and about 2%, respectively. According to this difference in lattice mismatch, Tm may have a nucleation frequency 10 to 20 times larger than Yb, or may have a nucleation velocity 10 to 20 times higher than Yb.

The CARP forming model indicates that the number of CARP in a unit volume becomes 10 to 20 times by a 10 to 20 times higher nucleation velocity. The size of CARP is proportional to an inverse of a cube root thereof. Therefore, it is considered that a CARP radius is from 0.46 to 0.37 times. Tm was used under a condition in which an effect was slightly observed in Yb excess CARP, and the size of CARP became smaller rapidly. Therefore, it is considered that a quantum magnetic flux was easily trapped by CARP to exhibit an effect.

In order to confirm the effect, FIG. 14 also illustrates a measurement result of the superconducting film 9FS-1% PrSm—Y—Tm containing CARP in the half amount in a magnetic field. Data in the center of FIG. 14 indicates this. CARP in this superconducting film has the same size and the half number theoretically. A result of almost the half was obtained. Strictly speaking, it is considered that the result is in the middle of a reduction amount of CARP as an obstacle and 9FS-2% PrSm—Y—Tm. However, it is considered that the difference was not observed due to being buried in experimental errors.

As indicated by this result, it is theoretically understood that CARP exhibits an effect by using Tm or an element closer to MA than Tm for CA. This is because the size of CARP can be explained by the CARP forming model. The size of CARP is determined by a nucleation frequency and the amount of substances present there. Therefore, an effect is exhibited by a combination of MA and CA having a large nucleation frequency.

From experiments so far, a simple substance which can be used for MA is only Y or Gd. However, it is known that a solution is obtained by mixing. As CA with respect to such MA, Er or Tm is good, and it is also considered that the size is adjusted by adding Yb partially. Of course, it is also possible to make an adjustment by mixing an element having a smaller atomic number than Er partially. By a combination of elements in the above range, a characteristic improvement at 30 K, which is considered to be particularly important in practical use, has been observed.

As described above, a combination in which an artificial pin to improve a characteristic at 30 K is formed particularly easily has been found by applying the CARP forming model. This is mainly a superconductor using Er or Tm for CA and using Y or the like for MA. In addition, it is considered that a combination matched with this model will exhibit an effect. It seems that the above combination is good particularly for exhibiting an effect at 30 K.

In the embodiments, the superconducting wire has been exemplified. However, the oxide superconductors of the present embodiments can be applied also to other applications such as a thin film on a single crystal substrate, requiring a high magnetic field characteristic.

While certain embodiments have been described, these embodiments have been presented by way of example only, and are not intended to limit the scope of the inventions. Indeed, the oxide superconductor and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An oxide superconductor, comprising:
   an oxide superconductor layer having a continuous Perovskite structure including rare earth elements, barium (Ba), and copper (Cu),
   wherein:
   the rare earth elements include a first element, at least one second element, at least one third element, and at least one fourth element,
   the first element is praseodymium (Pr),
   the at least one second element is selected from the group consisting of neodymium (Nd), samarium (Sm), europium (Eu), and gadolinium (Gd),
   the at least one third element is selected from the group consisting of yttrium (Y), terbium (Tb), dysprosium (Dy), and holmium (Ho),
   the at least one fourth element is selected from the group consisting of erbium (Er), thulium (Tm), ytterbium (Yb), and lutetium (Lu), and
   when the number of atoms of the first element is N(PA), the number of atoms of the at least one second element is N(SA), and the number of atoms of the at least one fourth element is N(CA), $1.5\times(N(PA)+N(SA))\leq N(CA)$ or $2\times(N(CA)-N(PA))\leq N(SA)$ is satisfied.

2. The oxide superconductor according to claim 1, wherein:
   $1.5\times(N(PA)+N(SA))\leq N(CA)$ is satisfied,
   the at least one second element is selected from the group consisting of neodymium (Nd) and samarium (Sm),
   the at least one third element is selected from the group consisting of yttrium (Y), dysprosium (Dy), and holmium (Ho), and
   the at least one fourth element is selected from the group consisting of erbium (Er), thulium (Tm), and ytterbium (Yb).

3. The oxide superconductor according to claim 1, wherein:
   $1.5\times(N(PA)+N(SA))\leq N(CA)$ is satisfied,
   the at least one second element is samarium (Sm),
   the at least one third element is selected from the group consisting of yttrium (Y) and holmium (Ho), and
   the at least one fourth element is selected from the group consisting of erbium (Er) and thulium (Tm).

4. The oxide superconductor according to claim 1, wherein the oxide superconductor layer includes fluorine (F) of $2.0\times10^{15}$ is atoms/cc or more and $5.0\times10^{19}$ atoms/cc or less and carbon (C) of $1.0\times10^{17}$ atoms/cc or more and $5.0\times10^{20}$ atoms/cc or less.

5. The oxide superconductor according to claim 1, wherein, when the number of atoms of the rare earth elements is N(RE), and the number of atoms of the at least one third element is N(MA), $N(MA)/N(RE)\geq 0.6$ is satisfied.

6. The oxide superconductor according to claim 1, wherein, when the number of atoms of the rare earth elements is N(RE), and the number of atoms of the first element is N(PA), $0.00000001\leq N(PA)/N(RE)$ is satisfied.

7. The oxide superconductor according to claim 1, wherein, when the number of atoms of the first element is N(PA), the number of atoms of the at least one second element is N(SA), and the number of atoms of the at least one fourth element is N(CA), $4\times(N(PA)+N(SA))\leq N(CA)$ is satisfied.

8. The oxide superconductor according to claim 1, further comprising:
   a substrate; and
   a metal layer, wherein the oxide superconductor layer is disposed between the substrate and the metal layer.

9. The oxide superconductor according to claim 1, wherein the continuous Perovskite structure has a size of 500 nm×100 nm or more in a cross section of the oxide superconductor layer in a layer thickness direction thereof.

10. An oxide superconductor, comprising:
an oxide superconductor layer having a continuous Perovskite structure including rare earth elements, barium (Ba), and copper (Cu),
wherein:
the rare earth elements include a first element, at least one second element, at least one third element, and at least one fourth element,
the first element is praseodymium (Pr),
the at least one second element is selected from the group consisting of neodymium (Nd), samarium (Sm), europium (Eu), and gadolinium (Gd),
the at least one third element is selected from the group consisting of yttrium (Y), terbium (Tb), dysprosium (Dy), and holmium (Ho),
the at least one fourth element is selected from the group consisting of erbium (Er), thulium (Tm), ytterbium (Yb), and lutetium (Lu), and
at least one of the at least one second element and the at least one fourth element includes two or more elements.

11. The oxide superconductor according to claim 10, wherein:
the at least one second element is selected from the group consisting of neodymium (Nd) and samarium (Sm),
the at least one third element is selected from the group consisting of yttrium (Y), dysprosium (Dy), and holmium (Ho), and
the at least one fourth element includes two or more elements selected from the group consisting of erbium (Er), thulium (Tm), and ytterbium (Yb).

12. The oxide superconductor according to claim 10, wherein:
the at least one second element is samarium (Sm),
the at least one third element is selected from the group consisting of yttrium (Y) and holmium (Ho), and
the at least one fourth element is erbium (Er) and thulium (Tm).

13. The oxide superconductor according to claim 10, wherein the oxide superconductor layer includes fluorine (F) of $2.0 \times 10^{15}$ atoms/cc or more and $5.0 \times 10^{19}$ atoms/cc or less and carbon (C) of $1.0 \times 10^{17}$ atoms/cc or more and $5.0 \times 10^{20}$ atoms/cc or less.

14. The oxide superconductor according to claim 10, wherein, when the number of atoms of the rare earth elements is N(RE), and the number of atoms of the at least one third element is N(MA), N(MA)/N(RE)≥0.6 is satisfied.

15. The oxide superconductor according to claim 10, wherein, when the number of atoms of the rare earth elements is N(RE), and the number of atoms of the first element is N(PA), 0.00000001≤N(PA)/N(RE) is satisfied.

16. The oxide superconductor according to claim 10, further comprising:
a substrate; and
a metal layer,
wherein the oxide superconductor layer is disposed between the substrate and the metal layer.

17. An oxide superconductor, comprising an oxide superconductor layer having a continuous Perovskite structure including rare earth elements, barium (Ba), and copper (Cu),
wherein:
the rare earth elements include a first element, at least one second element, and at least one third element,
the first element is praseodymium (Pr),
the at least one second element is selected from the group consisting of gadolinium (Gd), yttrium (Y), terbium (Tb), dysprosium (Dy), and holmium (Ho),
the at least one third element is selected from the group consisting of erbium (Er), thulium (Tm), ytterbium (Yb), and lutetium (Lu), and
when the number of atoms of the first element is N(PA), and the number of atoms of the at least one third element is N(CA), 1.5×N(PA)≤N(CA) is satisfied.

18. The oxide superconductor according to claim 17, wherein the oxide superconductor layer includes fluorine (F) of $2.0 \times 10^{15}$ atoms/cc or more and $5.0 \times 10^{19}$ atoms/cc or less and carbon (C) of $1.0 \times 10^{17}$ atoms/cc or more and $5.0 \times 10^{20}$ atoms/cc or less.

19. An oxide superconductor, comprising:
an oxide superconductor layer having a continuous Perovskite structure including rare earth elements, barium (Ba), and copper (Cu),
wherein:
the rare earth elements include a first element, at least one second element, and at least two third elements,
the first element is praseodymium (Pr),
the at least one second element is selected from the group consisting of gadolinium (Gd), yttrium (Y), terbium (Tb), dysprosium (Dy), and holmium (Ho), and
the at least two third elements is selected from the group consisting of erbium (Er), thulium (Tm), ytterbium (Yb), and lutetium (Lu).

20. The oxide superconductor according to claim 19, wherein the oxide superconductor layer includes fluorine (F) of $2.0 \times 10^{15}$ atoms/cc or more and $5.0 \times 10^{19}$ atoms/cc or less and carbon (C) of $1.0 \times 10^{17}$ atoms/cc or more and $5.0 \times 10^{20}$ atoms/cc or less.

21. An oxide superconductor, comprising:
on oxide superconductor layer having a continuous Perovskite structure including rare earth elements, barium (Ba), and copper (Cu),
wherein the rare earth elements include a first element being praseodymium (Pr), a second element being samarium (Sm), at least one third element being selected from the group consisting of yttrium (Y) and holmium (Ho), and a fourth element being thulium (Tm).

22. The oxide superconductor according to claim 21, wherein the oxide superconductor layer includes fluorine (F) of $2.0 \times 10^{15}$ atoms/cc or more and $5.0 \times 10^{19}$ atoms/cc or less and carbon (C) of $1.0 \times 10^{17}$ atoms/cc or more and $5.0 \times 10^{20}$ atoms/cc or less.

23. The oxide superconductor according to claim 21, wherein, when the number of atoms of the rare earth elements is N(RE), and the number of atoms of the at least one third element is N(MA), N(MA)/N(RE)≥0.6 is satisfied.

24. The oxide superconductor according to claim 21, wherein, when the number of atoms of the rare earth elements is N(RE), and the number of atoms of the first element is N(PA), 0.00000001≤N(PA)/N(RE) is satisfied.

* * * * *